United States Patent
Sdrulla et al.

(10) Patent No.: US 8,674,439 B2
(45) Date of Patent: Mar. 18, 2014

(54) LOW LOSS SIC MOSFET

(75) Inventors: Dumitru Sdrulla, Bend, OR (US); Bruce Odekirk, Bend, OR (US); Marc Vandenberg, Bend, OR (US)

(73) Assignee: Microsemi Corporation, Bend, OR (US)

( * ) Notice: Subject to any disclaimer, the term of this patent is extended or adjusted under 35 U.S.C. 154(b) by 45 days.

(21) Appl. No.: 13/195,632

(22) Filed: Aug. 1, 2011

(65) Prior Publication Data

US 2013/0256698 A1  Oct. 3, 2013

Related U.S. Application Data

(60) Provisional application No. 61/369,765, filed on Aug. 2, 2010.

(51) Int. Cl.
*H01L 29/78* (2006.01)

(52) U.S. Cl.
USPC ............ 257/341; 257/77; 257/E29.257

(58) Field of Classification Search
CPC ............ H01L 29/7802; H01L 29/1608; H01L 29/42368; H01L 29/1095; H01L 29/7801
USPC ............ 257/341, 77, 335, 339, 340, E29.257
See application file for complete search history.

(56) References Cited

U.S. PATENT DOCUMENTS

| | | | |
|---|---|---|---|
| 5,468,654 A | 11/1995 | Harada | |
| 5,506,421 A | 4/1996 | Palmour | |
| 5,510,281 A * | 4/1996 | Ghezzo et al. | 438/268 |
| 5,963,807 A | 10/1999 | Ueno | |
| 6,201,280 B1 | 3/2001 | Bakowski et al. | |
| 6,503,786 B2 | 1/2003 | Klodzinski | |
| 6,653,659 B2 | 11/2003 | Ryu et al. | |

(Continued)

FOREIGN PATENT DOCUMENTS

| | | |
|---|---|---|
| EP | 0772241 A1 | 5/1997 |
| EP | 2242107 A1 | 10/2010 |
| JP | 2009032919 | 2/2009 |
| WO | 2010073991 A1 | 7/2010 |

OTHER PUBLICATIONS

Spirito, P., et al. "Analytical Model for Thermal Instability of Low Voltage Power MOS and S.O.A. in Pulse Operation," Proceedings International Symposium on Power Semiconductor Devices and IC's, 2002, pp. 269-272.

(Continued)

*Primary Examiner* — Yu Chen
(74) *Attorney, Agent, or Firm* — Marger Johnson & McCollom, PC

(57) ABSTRACT

A Vertical Multiple Implanted Silicon Carbide Power MOSFET (VMIMOSFET) includes a first conductivity semiconductor substrate, a first conductivity semiconductor drift layer on the top of the substrate, a multitude of second conductivity layers implanted in the drift layer. The body layer is where the channel is formed. A first conductivity source layer is interspaced appropriately inside of the second conductivity layers. A gate oxide of a certain thickness and another oxide of a different thickness, a greater thickness than the gate oxide, placed in between the body layers but in such way that its shape does not distort the gate oxide in the channel. A charge compensated body layer of the second conductivity formed outside of the channel region and only at specific high electric field locations in the structure. The device and the manufacturing method deliver a power SiC MOSFET with increased frequency of operation and reduced switching losses.

9 Claims, 21 Drawing Sheets

(56) References Cited

U.S. PATENT DOCUMENTS

| | | | |
|---|---|---|---|
| 6,664,594 | B2 | 12/2003 | Klodzinski |
| 7,217,954 | B2 | 5/2007 | Kusumoto et al. |
| 7,221,010 | B2 | 5/2007 | Ryu |
| 7,381,992 | B2 | 6/2008 | Ryu |
| 7,691,711 | B2 | 4/2010 | Stum et al. |
| 8,110,472 | B2 | 2/2012 | Hebert et al. |
| 2003/0107041 | A1 | 6/2003 | Tanimoto et al. |
| 2003/0201456 | A1 | 10/2003 | Saitoh et al. |
| 2004/0036113 | A1 | 2/2004 | Ueno |
| 2004/0119076 | A1* | 6/2004 | Ryu ............................ 257/77 |
| 2004/0188755 | A1 | 9/2004 | Tarui et al. |
| 2007/0215914 | A1* | 9/2007 | Loechelt .................... 257/288 |
| 2012/0018743 | A1 | 1/2012 | Hiyoshi et al. |
| 2012/0153303 | A1 | 6/2012 | Uchida |

OTHER PUBLICATIONS

Ryu, Sei-Hyung, et al., 4H-SiC DMOSFETs for High Frequency Power Switching Applications, Mat. Res. Soc. Symp. Proc. vol. 764, 2003 Materials Research Society.

Palmour, et al., John W., "Silicon Carbide Switching Devices: Pros and Cons for Mosfets, JFETs and BJTs," Proceedings PCIM Europe Conference, 2009, pp. 311-316.

Matocha, et. al, Kevin, "1400 Volt, 5 mΩ-cm2 SiC MOSFETs for High Speed Switching," Proceedings of the 22nd International Symposium on Power Semiconductor Devices & ICs, Hiroshima, Japan, pp. 365-368, 2010.

Sung, et al., Woongje, "A Novel 4H-SiC IGBT Structure with Improved Trade-off between Short Circuit Capability and On-state Voltage Drop", Proceedings of the 22nd International Symposium on Power Semiconductor Devices & ICs, Hiroshima, Japan, pp. 217-220, 2010.

Matocha, et. el, Kevin, Time-Dependent Dielectric Breakdown of 4H-SiC MOS Capacitors and DMOSFETs, IEEE Trans. on Elec. Dev. vol. 55, No. 8, Aug. 2008, pp. 1830-1834.

Sugawara, et al., Y., 4.5 kV Novel High Voltage High Performance SiC-FET "SIAFET", IEEE Catalog No. 00CH37094C, ISPSD 2000, 4 pages.

Peters, et al., Dethard, An 1800 V Triple Implanted Vertical 6H-SiC MOSFET, IEEE Trans. on Elec. Dev., vol. 46, No. 3, Mar. 1999, pp. 542-545.

Losee, et al., Pete A., "DC and Transient Performance of 4H-SiC Double-Implant MOSFETs," IEEE Trans on Elec. Dev., vol. 55, No. 8, Aug. 2008, pp. 1824-1829.

Takayama, et al., D., Static and Dynamic Characteristics of 4-6 kV 4H-SiC SIAFETs, ISPSD. Osaka, Japan, 2001, pp. 41-44.

Miura, et al., Naruhisa, Successful Development of 1.2 kV 4H-SiC MOSFETs with the Very Low On-Resistance of 5mΩ-cm2, ISPSD Jun. 4-8, 2006, Naples, Italy, 4 pages.

Ruff, et al., Martin, "SiC Devices: Physics and Numerical Simulation", IEEE Trans. on Elec. Dev. vol. 41, No. 6, Jun. 1994, pp. 1040-1054.

Ryu, et al., Sei-Hyung, "10kV, 5A, 4H-SiC Power DMOSFET" ISPSD Jun. 4-8, 2006, Naples, Italy, 4 pages.

Cooper, et al., James A., "Status and Prospects for SiC Power MOSFETs," IEEE Trans. on Elec. Dev. vol. 49, No. 4., Apr. 2002, pp. 658-664.

Potbhare, et al., Siddharth, "A Physical Model of High Temperature 4H-SiC MOSFETs", IEEE Trans. on Elec. Dev., vol. 55, No. 8, Aug. 2008, pp. 2029-2040.

Lu, et al., Chao-Yang, "Effect of Process Variations and Ambient Temperature on Electron Mobility at the SiO2/4H-SiC Interface", IEEE Trans., on Elec. Dev., vol. 50, No. 7, Jul. 2003, pp. 1582-1588.

Ueda, et al., Daisuke, "A New Vertical Double Diffused MOSFET—The Self-Aligned Terraced-Gate MOSFET," IEEE Transactions on Electron Devices, vol. ED-31, No. 4, Apr. 1984, pp. 416-420.

Cree, Inc., Z-FET CMF20120D Industry's First SiC MOSFET sales flyer, 2011, Durham, North Carolina, 2 pages, www.cree.com.

Cree, Inc., CMF20120D—Silicon Carbide Power MOSFET 1200 v 80 MΩ, Z-FET MOSFET N-Channel Enhancement Mode data sheet, 2010-2011, Durham, North Carolina, pp. 1-13, www.cree.com/power.

European Patent Office, International Searching Authority, PCT/US2013/047145, International Search Report/Writtenn Opinion, 11 pages, Oct. 22, 2013, Rijswijk, The Netherlands.

Fujihira, K., et al., "Realization of Low On-resistance 4H-SiC Power MOSFETs by Using Retrograde Profile in P-Body," Materials Science Forum, Trans Tech Publications, LTD-Switzerland, vols. 556-557, Sep. 15, 2007, pp. 827-830.

European Patent Office, International Searching Authority, PCT/US2013/033330, International Search Report/Written Opinion, 13 pages, Nov. 13, 2013, Rijswijk, The Netherlands.

* cited by examiner

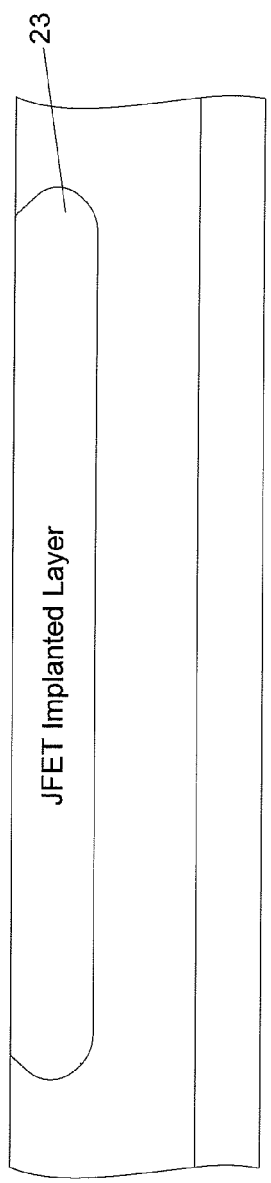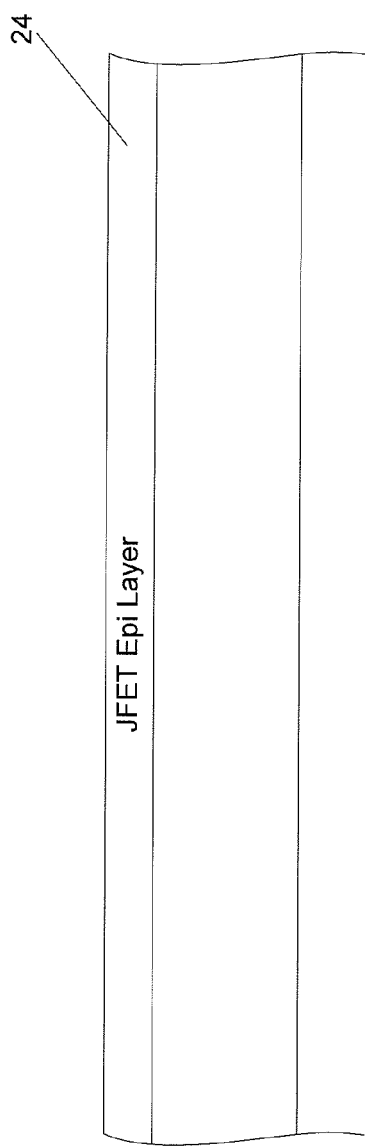
FIG. 7A
FIG. 7B

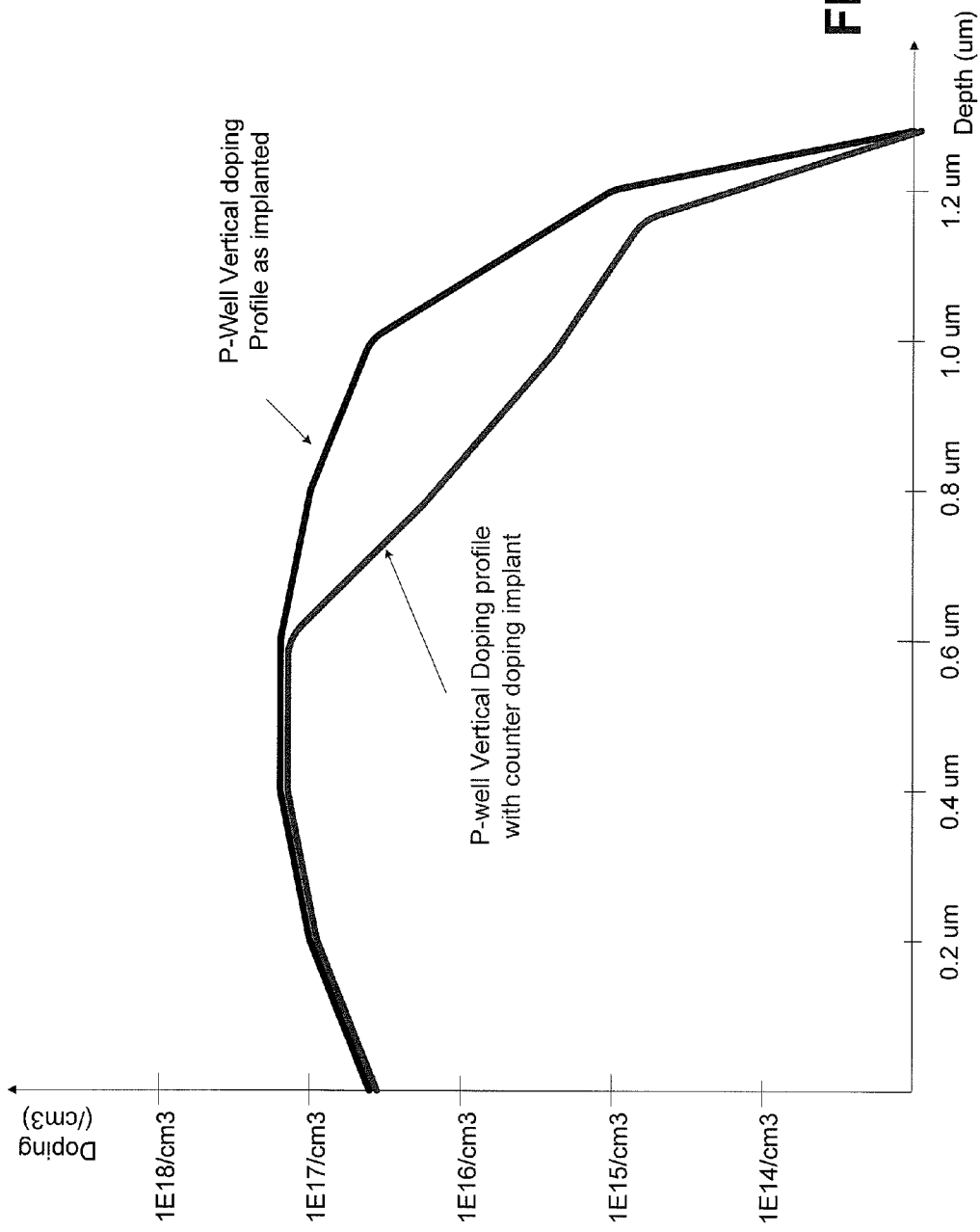

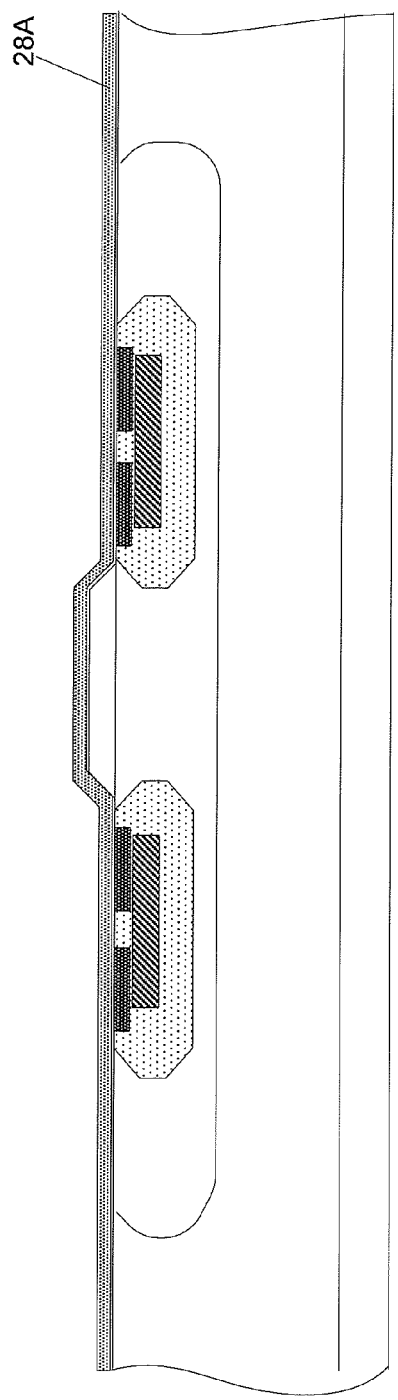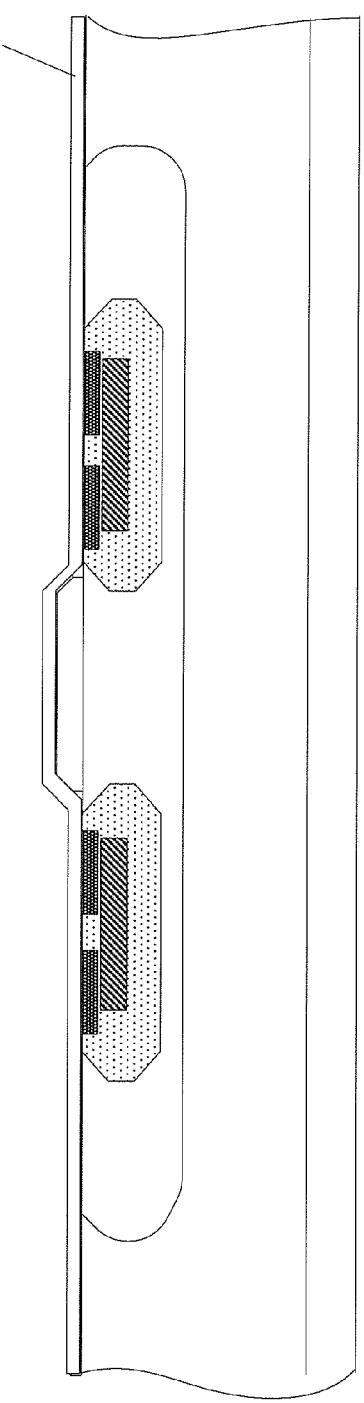
FIG. 17A
FIG. 17B

LOW LOSS SIC MOSFET

CROSS REFERENCE TO RELATED APPLICATION

This application claims the benefit of U.S. provisional patent application Ser. No. 61/369,765, filed Aug. 2, 2010, herein incorporated by reference.

BACKGROUND OF THE INVENTION

Field of Invention

The present invention relates to semiconductor devices and fabrication of semiconductor devices and more specifically to the Silicon Carbide (SiC) Power Field Effect Metal Oxide Semiconductor Transistors (Power MOSFET on SiC).

Power MOSFETs are widely used in high frequencies applications due to many inherent favorable characteristics such as high input impedance, ease of implementation of gate control circuitry, positive temperature coefficient of the On Resistance and large safe operating area.

The high frequency performance of a Power MOSFET is strongly dependent on the input capacitance of the device as illustrated in the formula describing the maximum frequency of operation, Fmax:

$$Fmax = gm/2\pi Cin$$

In this equation the input capacitance, Cin, includes the gate to source capacitance Cgs and the gate to drain capacitance, Cgd. Both are important, however Cgd plays a major role as it is "amplified" during the normal regime of operation of the MOSFET by the voltage gain of the device, known as the Miller effect. Any reduction of the gate source or the gate drain capacitances will significantly improve the switching speed, or frequency of operation.

FIG. 2A is a depiction of the gate charge of a power MOSFET as a function of time, with the x-axis depicting time and the y-axis depicting Vgs, i.e., the gate to source voltage. The horizontal "plateau" of the Gate Voltage versus time waveform is a measure of the charge "supplied" to the gate drain capacitance and therefore a large gate drain capacitance will translate into a large total gate charge of the Power MOSFET.

In further detail, the gate drain capacitance of a Power MOSFET consists of a "MOS capacitance" defined by the gate overlap over the drain region between the P-Wells, and the "Semiconductor" capacitance, defined by the depletion region extension in the N-layer (drift layer) between the P-Wells. The series configuration of two capacitances assumes the value closer to the value of the lower one.

Vertical Power MOSFETs on Silicon Carbide (hereinafter referred to as SiC) have multiple benefits over the Si counter part (lower On resistance, smaller die size higher temperature of operation, higher frequency of operation).
Some of these advantages are easy to be understood as the material properties of SiC are responsible for the better performances of a SiC Vertical Power MOSFET.

Nevertheless, lack of understanding of the tradeoffs of various parameters of power MOSFET in relationship to the layout and process design can seriously limit or degrade the electrical behavior of such a device.

For example, in order to lower the On Resistance of a power MOSFET a high packing density design would be highly desirable as the channel resistance in the case of a high voltage SiC MOSFET is a significant part of the total On Resistance. On the other hand a high packing density design approach increases the input and reverse capacitances of the MOSFET, with detrimental effect on the switching times and therefore on the frequency of operation and the total switching energy loss. That is the reason why trench MOSFETs (either on Silicon or SiC) have high input and transfer capacitances and also a very high transconductance. It is well known to the people familiar with the field that a MOSFET is a voltage driven device and charging and discharging the input and transfer capacitances through the gate resistance (external and internal) increases the switching times as the rise and fall times are proportional to the gate resistance and the capacitances "seen" by the driving circuit. It is important to note that the value of the transfer capacitance will be multiplied by the voltage gain (Miller effect) during the charging and discharging (and therefore switching) process; therefore, a small Crss (transfer capacitance) of a MOSFET is highly desirable.

For silicon carbide (SiC) MOSFETs, where due to material properties of SiC, the doping of the drift region of a high voltage power MOSFET made on SiC is almost 10 times higher than the doping of a Silicon made part for the same breakdown voltage, the capacitance determined by the space charge will be quite high. This difference in doping concentration increases the transfer capacitance, even though the die size of a SiC part is significantly lower than the die size of a silicon (Si) MOSFET. Adjusting down the resistivity of the drift layer in order to lower the gate drain capacitance is counter productive, since this results in an undesired sharp increase in On Resistance. It is therefore important to find alternative ways of lowering Cgd without impacting the main parameters of the device.

The determining factor in the switching speed time (and the amount of the gate charge) is the value of the transfer capacitance at low drain source bias. As one can see in FIG. 2B the value of Crss at zero volts is almost two orders of magnitude higher than its value at an increased Vds. At zero volts the transfer capacitance is dominated by the gate drain overlap area and the oxide under the gate electrode, where it reaches its maximum value.

Moreover, high input and reverse capacitances of a Power MOSFET translate into a part with high gate charge (the electrical charge required to be supplied to the gate for the device to be turned on and off). A high charge driver is larger and, therefore, limits the system size reduction.

The need to lower the capacitances of a SiC MOSFET has been already identified by people familiar with the art. For example, in U.S. Pat. No. 5,506,421 "Silicon Carbide MOSFET having self aligned gate structure", the typical misalignment errors between ion implantation masks are mitigated by the use of a "self aligned" gate process. Even so, the gate drain overlap issue is not addressed in this or in any of the other known patents or publications pertaining to SiC power MOSFETs.

Lowering the transfer capacitance of power MOSFETs made on silicon (vertical, trench or lateral) has been the objective of many researchers.

Although the switching losses of prior art SiC MOSFETs are about 10 times lower than an equivalent IGBT, when comparing the gate charge and capacitances, the IGBT is favored. (Kevin Matocha at all, "1400 Volt, 5 mohm-cm² SiC MOSFET for High Speed Switching, ISPSD2010. pp 365-368). According to his measurements, the IGBT has almost half of the gate charge and device capacitances in comparison to the power SiC MOSFET described in the paper.

Reduction of the gate drain overlap capacitance in a silicon Vertical double diffused MOSFET was demonstrated in the paper "A new vertical Double Diffused MOSFET—The self aligned Terraced Gate MOSFET" published by Ueda in IEEE Transaction on Electron Devices, Vol ED 31, No 4, April 1984. However, the breakdown voltage of the device was degraded.

In the case of trench MOSFETs, growing a thick oxide at the bottom of the trench minimizes the gate drain capacitance. FIG. 3 illustrates a UMOS trench transistor where the gate oxide at the bottom of the trench has been purposely thickened to minimize the Gate-Drain capacitance created by the polysilicon overlapping the drain.

In the case of an LDMOS transistor, in order to reduce the reverse capacitance Crss formed by the polysilicon gate overlapping the drain (outside of the channel), a thick gate oxide is formed and etched so as not to interfere with the gate oxide. The extension of the gate polysilicon sitting on that thick oxide has a significantly lower capacitance in comparison with an LDMOS transistor made with uniformly thin oxide (FIG. 4).

In each one of these cases, but more specifically in the case of the VDMOS structure, implementing a "terraced" structure has the detrimental effect of lowering the blocking voltage of the device.

For the person familiar with the physics of semiconductors, it is apparent that the coplanar extension of the gate electrode over the drain flanked by two P-wells creates electric field conditions in the structure such that the space charge under the gate extends between the P-wells at relatively low drain source bias and closely resembles the space charge distribution of a "planar" junction, which has the highest achievable breakdown voltage.

Adding a thick layer of oxide underneath the gate electrode of a VDMOS transistor degrades the "planarity" conditions of the space charge and creates curvatures with higher electric field and lower breakdown. The problem is even more exacerbated for SiC P-N junctions where the junctions are extremely shallow due to lack of diffusion in SiC of the implanted layers.

Thus there is a long felt need for a scheme to lower the gate drain capacitance with minimal or no impact on the other performance of the SiC Power MOSFET.

SUMMARY OF THE INVENTION

It is an object of this invention to address both the high Crss of a SiC VDMOS transistor and the lower than ideal breakdown voltage of such a structure due to low radius of curvature of body regions.

A first embodiment of the present invention is a method of reducing the gate overlap capacitance of a SiC Vertical Multiple Implanted MOSFET (VMIMOSFET) by forming P-type wells (Body) regularly spaced in the N-type doped drift layer, placing N-type ion implanted layers (source) inside of the P-wells, depositing and patterning a thicker oxide not only in the regions outside of the P-wells but over the drift region, overlaying the P-wells with a thin oxide (gate oxide), patterning polysilicon such that it overlays the P-wells and the N-type source regions, sealing the polysilicon with an inter-layer dielectric (ILD, preferable BPSG), opening vias in the ILD layer to access the sources and the gate poly at predetermined locations, and depositing and etching a layer of metal to form the top electrodes of the Power MOSFET.

In another embodiment of the invention, a method to etch the thick oxide layer overlaying the drift region is presented such that the edges of the thick oxide have controlled and reproducible tapered slopes. This is achieved by implanting the thick oxide with Argon, at prescribed doses and energies (dose in the range of $3E13/cm^2$-$1E14/cm^2$, energies in the range of 50-100 KeV).

In yet another embodiment of the invention, a heavily doped P-type layer is placed inside of the Body of the Power MOSFET self aligned to the N++ source implant. This first heavily doped implant layer (UIS1—Unclamped Inductive Switching 1) is offset from the N-type Ion Implanted layer (source) by a thin spacer, formed at the edge of the poly gate. Its dose and ion implantation energy are tailored in such a way that the UIS 1 P-type layer is placed underneath the "source" (N-type region inside of the P-wells) and has the role of reducing the parasitic resistance of the NPN transistor. This arrangement in turn improves the avalanche rating of the MOSFET, and therefore the unclamped inductive switching performance.

In further embodiments of the present invention, the corners of the P-type junctions are counter-doped with species of the opposite sign (N-type implant species). The N-type implants are aligned to the P-well windows and the doses and the energies of the implants are such that only the corners of the P-wells are counter-doped and the channel of the transistor remains unaffected. Such implants can be done using Nitrogen, through apertures provided by photoresist patterning. This counter doping recovers the breakdown voltage normally lost with a terraced oxide.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 7A and 7B are cross-sectional views showing the formation of JFET regions in the starting materials of FIGS. 6A and 6B.

FIG. 9B is a graph illustrating the P-well vertical doping profile in FIG. 9A in the center and at the edge of the P-well.

FIGS. 17A and 17B are cross-sectional views showing alternative embodiments of intermediate steps in the formation of the gate oxide layer in the structure of FIG. 16.

DETAILED DESCRIPTION

General Description

Figure 1A:
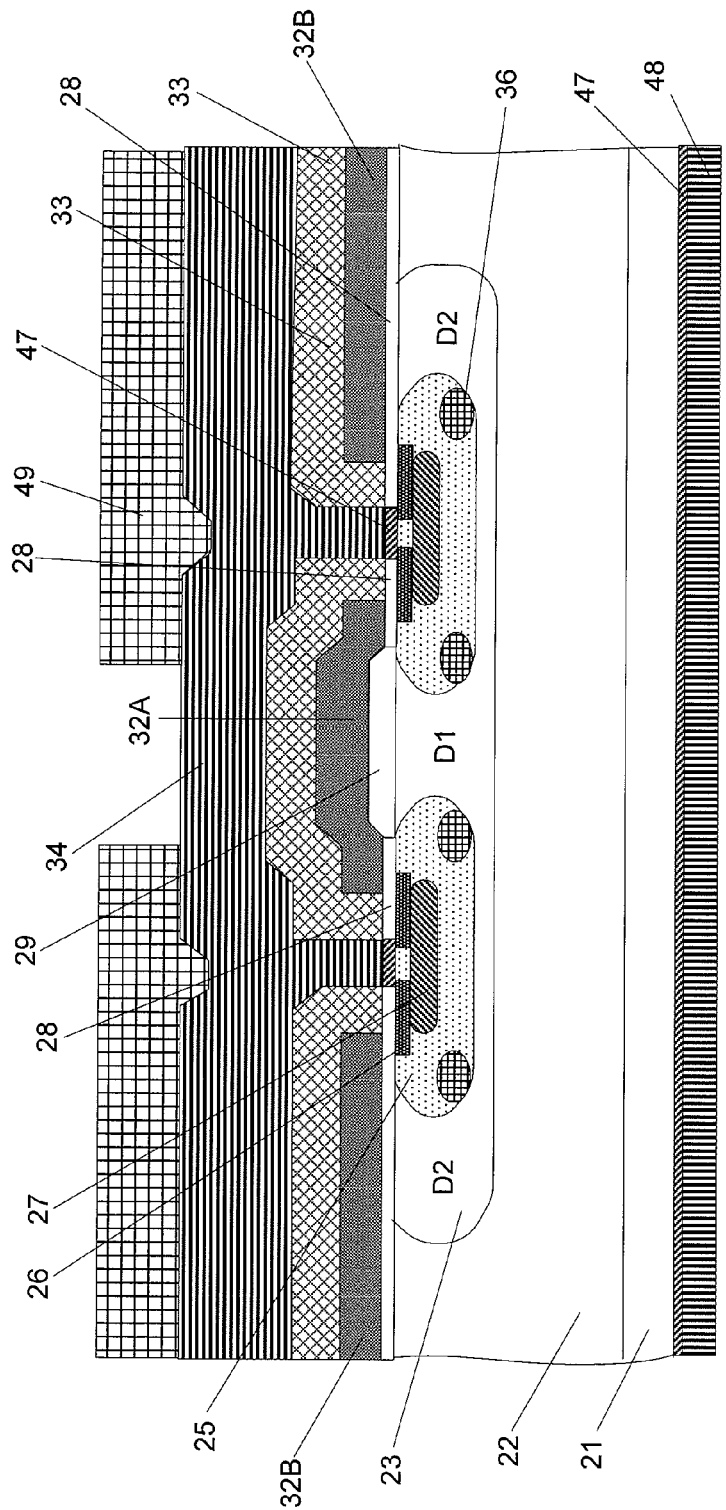
FIG. 1A is a cross section of a switch mode SiC power MOSFET according to the present invention.
Figure 1B:
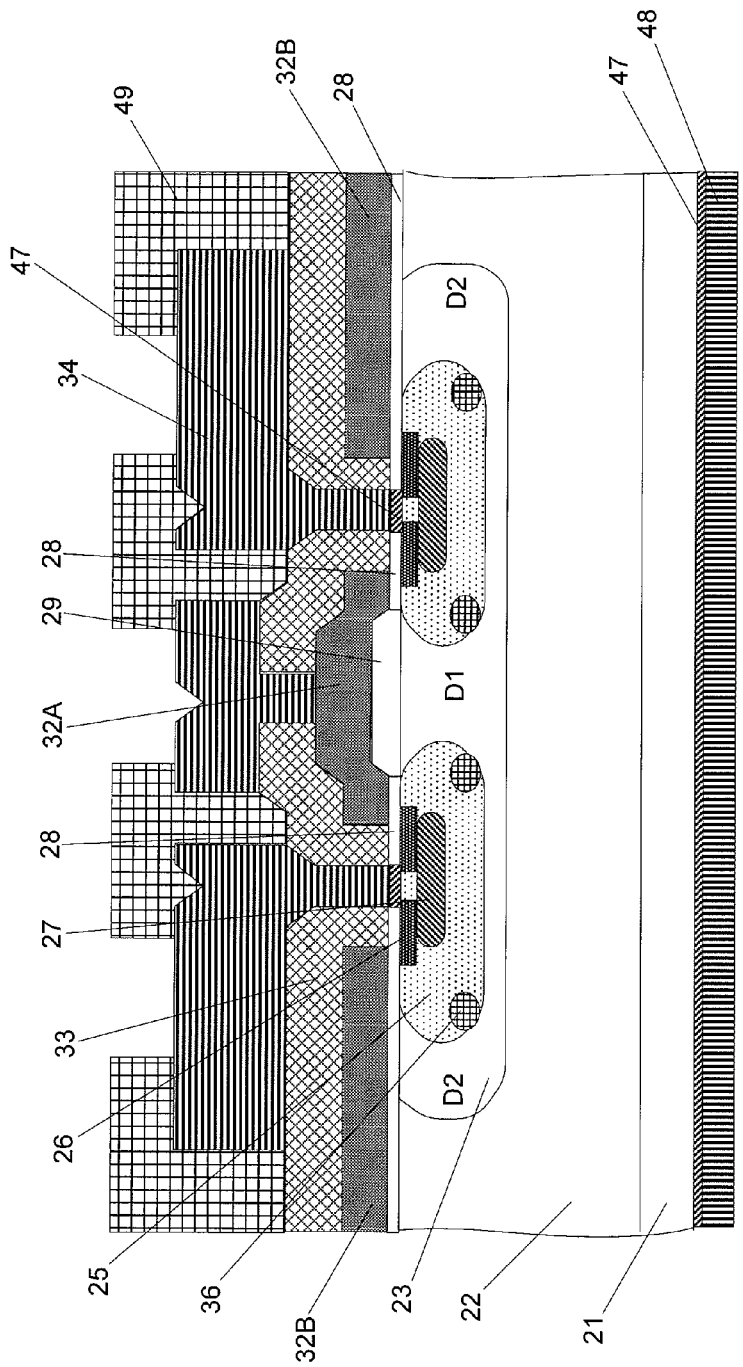
FIG. 1B is a cross section of a SiC power MOSFET of the present invention configured for RF performance.
Figure 2A:
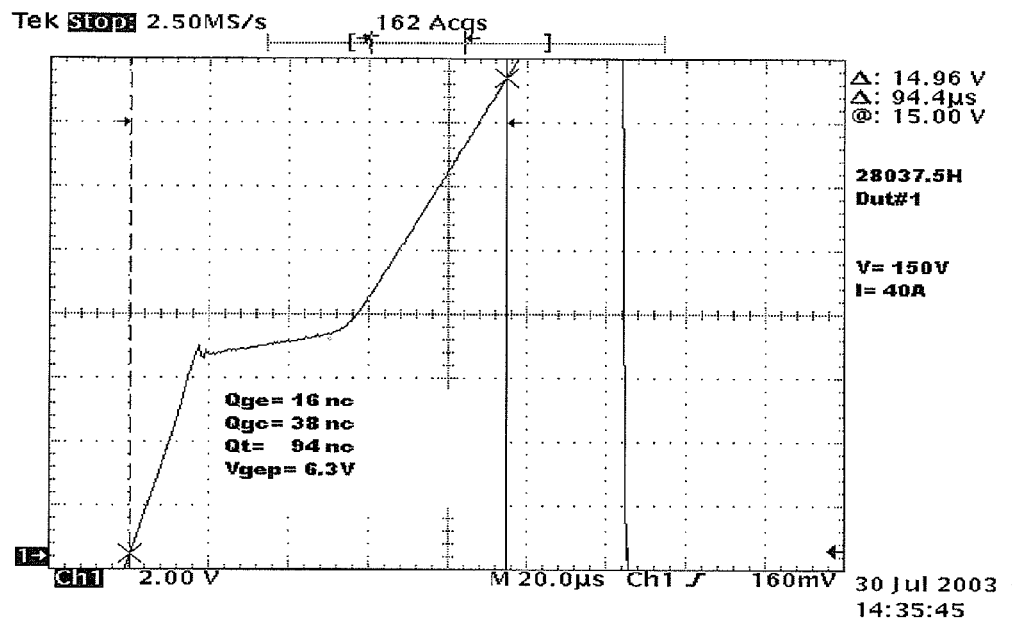
FIG. 2A is a typical gate change waveform of a power MOSFET.
Figure 2B:
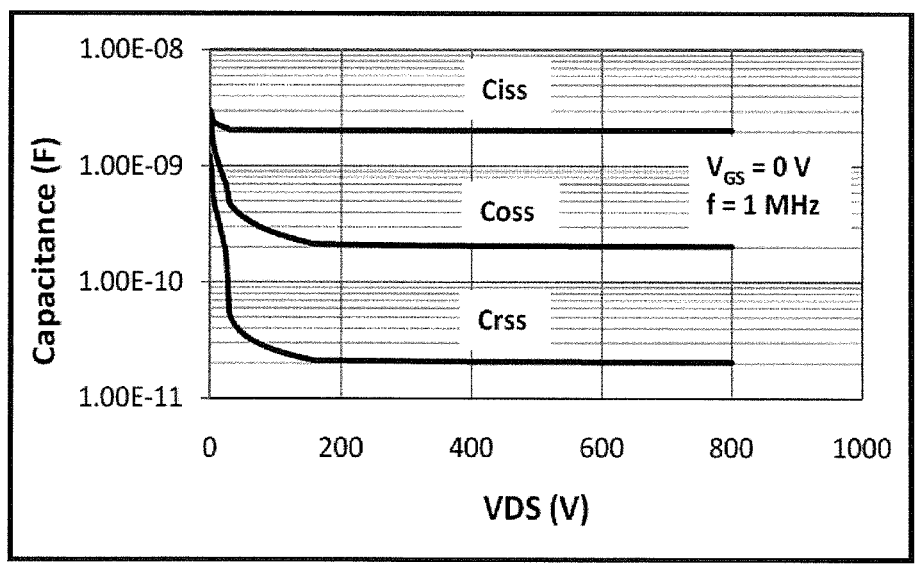
FIG. 2B is a graph of typical power MOSFET terminal capacitances.
Figure 3:
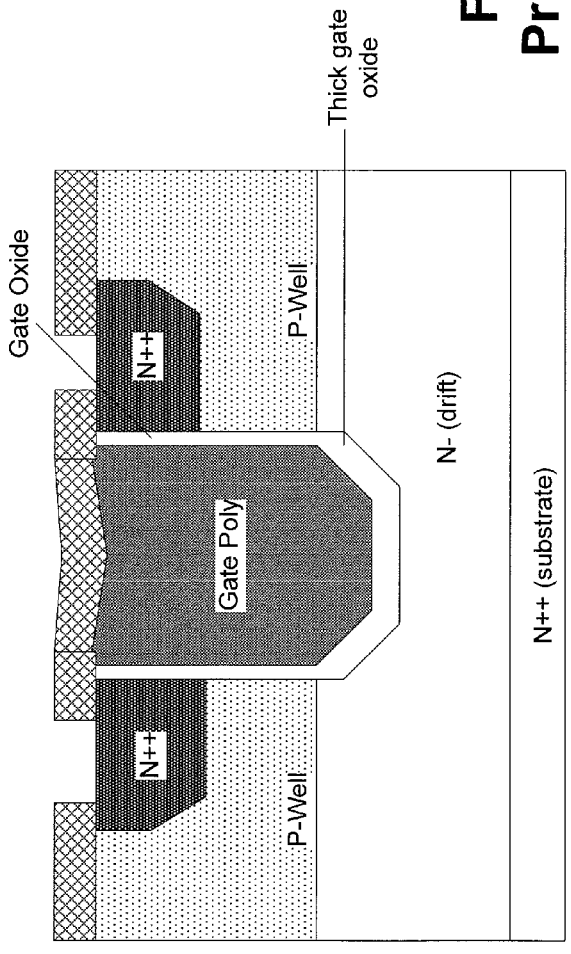
FIG. 3 is a cross section of a prior art UMOSFET with thick oxide at the base of the trench.
Figure 4:
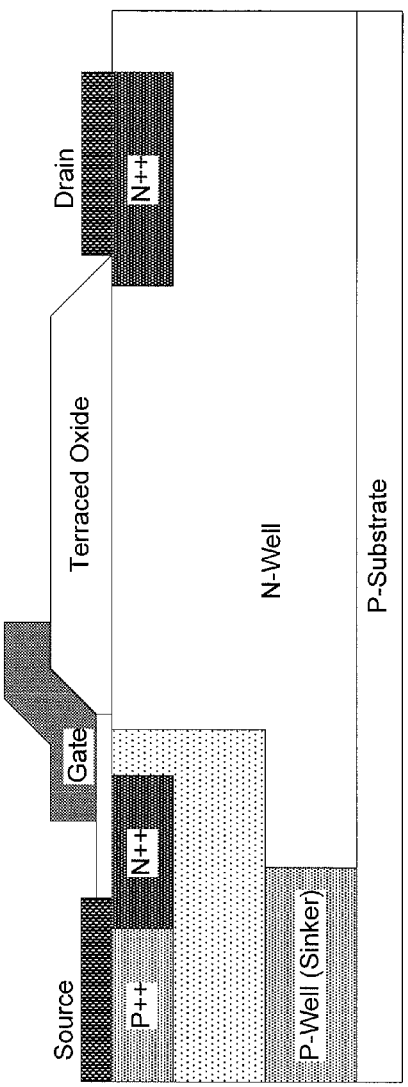
FIG. 4 is a cross section of a prior art LDMOSFET with polysilicon gate overlapping terraced oxide alongside the gate oxide.
Figure 5:
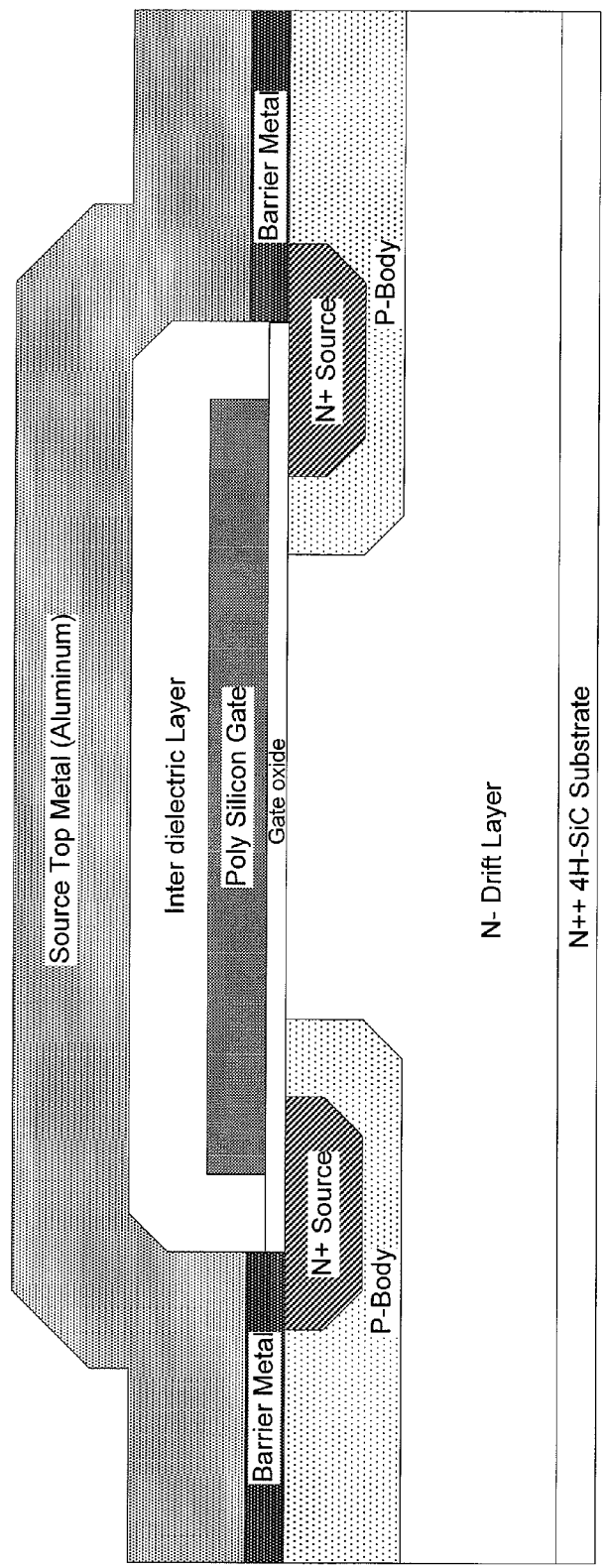
FIG. 5 is a cross section of a prior art Vertical SiC MOSFET.

Certain embodiments enabled herein reduce the gate drain capacitance of a SiC Power MOSFET by providing a "terrace" oxide of a significantly thicker thickness underneath the gate electrode, as illustrated in FIGS. 1A and 1B. The gate electrode may be formed of polysilicon ("poly") or any other type of gate electrode, including a metal gate, without limitation. The "placement" of the thick oxide is done is such way that the "channel oxide" remains unaffected and therefore the inversion layer in the channel is uniform over the entire length of the channel.

In one particular embodiment an oxide of a predetermined thickness is deposited across the entire wafer and then selectively removed from all areas except the regions in between the P-Body. Following this process step, the gate oxide is grown and from there on the standard process steps of a Power MOSFET process flow can be executed, such as, without limitation: Poly deposition; Poly etch; Interdielectric Layer formation; and Front metal deposition and etch.

In this way, the gate drain capacitance, mainly determined by the thickness of oxide between the poly electrode and the semiconductor, is greatly reduced and therefore the frequency of operation of a SiC MOSFET is significantly higher.

Figure 9A:
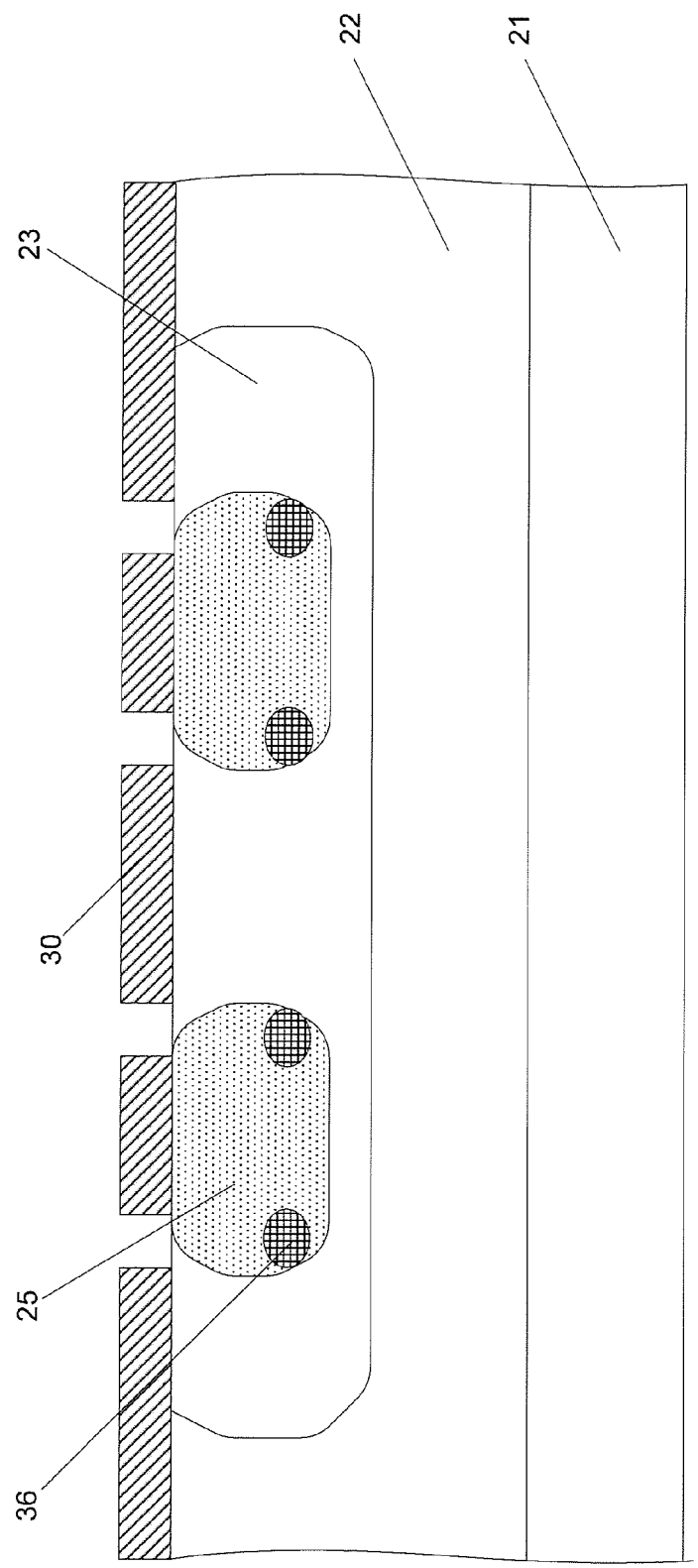
FIG. 9A is a cross-sectional view showing counter doping of the P wells of FIG. 8.

One drawback of this scheme to lower the gate drain capacitance is the fact that breakdown voltage of the device is impacted, in particular lowered, by the thickness of the oxide. To counterbalance this effect, in one embodiment a different doping, or counter doping, at the "edges" of the body region, in close proximity to the thick oxide underneath the poly, is provided, as illustrated in FIGS. 9A and 9B. In further explanation, formation of the terraced oxide has the benefit of lowering reverse transfer capacitance Crss, equivalent to lowering the gate charge Cgd, but has the drawback of depressing the breakdown rating of the MOSFET, BVdss. The counter doping of FIGS. 9A and 9B addresses this issue by creating a lower doping gradient at the edge of the P-Body and therefore creating a lower electric field and restoring the blocking capability.

Lower doping of the "corners"/"edges" of the body region is preferably accomplished by implanting, with the proper energy and dose, a species that creates a doping in the SiC layer of the opposite sign. In one particular non-limiting embodiment Nitrogen is implanted.

The present invention will be described in full detail, with reference to the cross sections and accompanying drawings and with emphasis on the methods to implement the main embodiments of the invention. In the cross sections and the drawings the thicknesses of various layers are not to scale but rather drawn with the intention to illustrate the scope of this invention.

It is also evident to the person familiar with this field that a real power MOSFET is constructed by repeating cells of the same layout and vertical composition of the layers as illustrated in the cross sections and drawings. The cells can be, for example, an array of stripes or a hexagonal honeycomb in plan view.

It is also apparent to the skilled person that this invention is applicable to both Power MOSFET and Power IGBTs made on SiC material.

SiC Vertical Power MOSFET Structure

Figure 20:
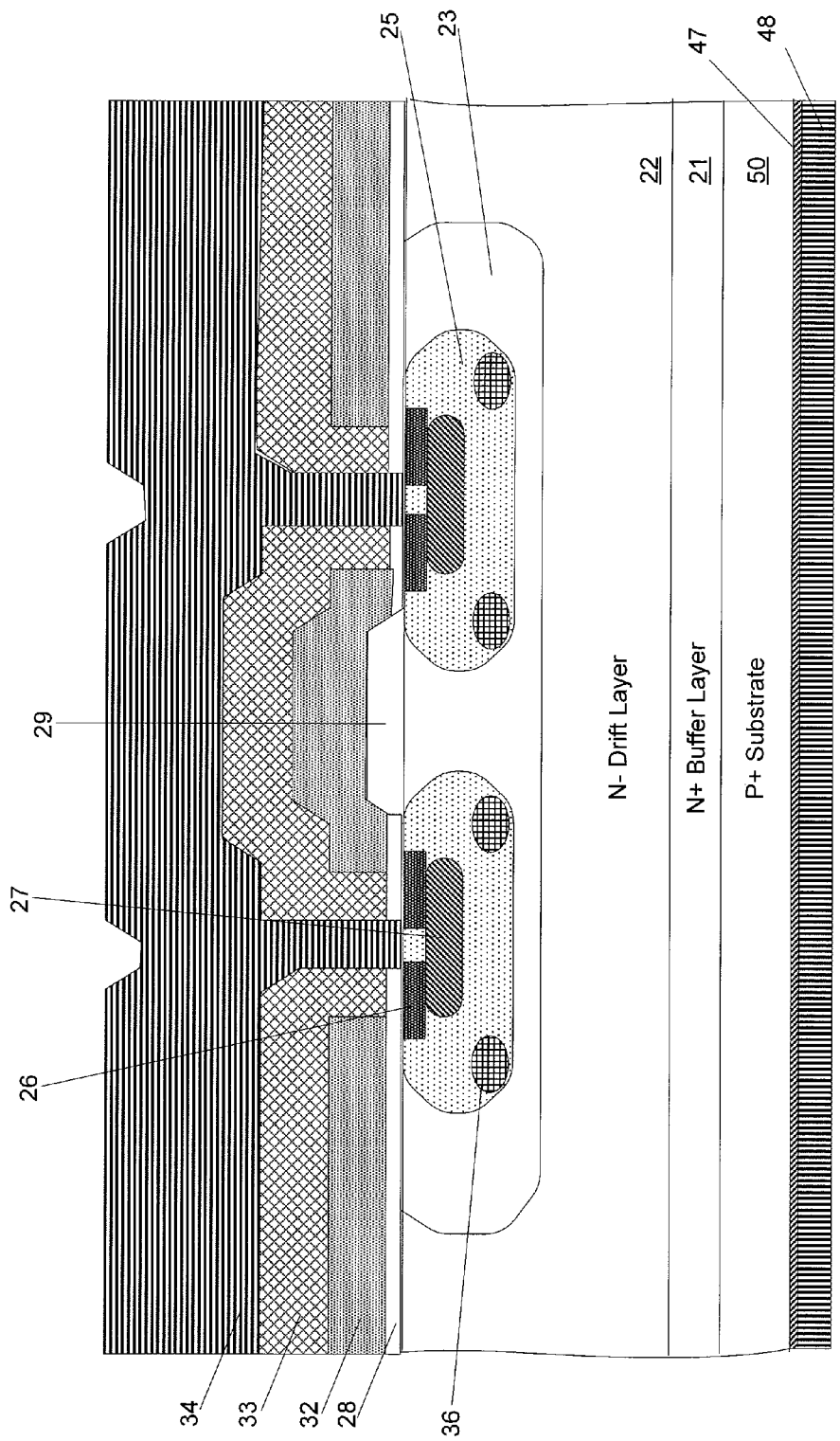
FIG. 20 is a cross-sectional view showing an alternative embodiment of the structure of FIG. 1A on a PN substrate to form an IGBT device.

A silicon carbide (SiC) vertical power MOSFET structure according to embodiments of the invention is shown in FIGS. 1A and 1B. Another embodiment, in which the same vertical power MOSFET structure is embodied in a SiC vertical IGBT, is shown in FIG. 20. Like reference numerals denote similar structures, and the same reference numerals are used in the description of the process for fabrication of the vertical power MOSFET structure.

In a preferred embodiment as shown in the drawings, the vertical power MOSFET structure includes a mono-crystalline SiC substrate 21 of a first dopant type including an upper layer 22 of the same dopant type defining a drift region extending from an upper surface of the substrate (demarcated by its interface to the gate oxide layer 28) depthwise into the substrate. In the depicted embodiments of FIGS. 1A and 1B, the first dopant type of the substrate in the drift region is N-type, in which case the second, opposite dopant type, for example, the body region 25, refers to P-type. Optionally, the first dopant type of the substrate can be P-type, in which case the opposite dopant type is N-type. For simplicity, we describe the vertical power MOSFET structure in terms of an N-type substrate having a P-type body region. In the case of the IGBT vertical power MOSFET structure of FIG. 20, the substrate further includes a bottom layer 50 of the second dopant type, P-type in the example shown, beneath the N-type substrate layers forming the drift or drain region. The P-type layer 50 can be formed using a P-type monocrystalline substrate on which the N-type layers are epitaxially deposited or by ion-implantation of P-type species into the backside of an N-type wafer.

Preferably, a JFET region 23 of the first dopant type (N-type as shown) is formed in or on an upper portion of the upper layer, enhancing a doping concentration of the drift region around and particularly between the body regions. Alternative forms of the JFET layer are shown in FIGS. 7A and 7B, as discussed below in the process description.

A pair of body regions 25 reside in the upper layer, within the JFET region 23, and adjoining the upper surface of the substrate. The body regions 25 are spaced apart about the portion of the drift region within the JFET region. The body regions are of the second dopant type opposite the first dopant type, that is, P-type in the illustrated example. Each of the body regions has opposite lateral peripheries each forming a first PN junction with the drift region.

A pair of source regions 26 is spaced apart in each body region 25 across the upper surface of the substrate to define a source and body contact region at the surface. The source regions 26 are positioned laterally with respect to the lateral peripheries of the respective body regions to form a second PN junction spaced laterally from the first PN junction. This spacing serves to define a channel region along the upper surface between the first and second PN junctions.

A UIS region 27 of the second dopant type is positioned depthwise in the upper layer beneath the source regions and centered between them inward from the channel regions, to enhance a doping concentration of the body regions beneath the source regions without affecting gate threshold voltage.

A gate oxide layer 28 of a first thickness on the upper surface of the substrate extends over each of the channel regions. A gate conductor 32A, 32B, typically of doped polysilicon, contacts the gate oxide layer and is coupled either to an electrode at the periphery of the substrate in the case of switch mode devices (FIG. 1A) or directly to a metal electrode that extends along the polysilicon through a gate via in the interlayer dielectric layer 33. A source conductor 34 contacts the source regions and the body region therebetween at the upper surface of the substrate.

A terraced dielectric layer 29, typically silicon oxide, extends on the upper surface between the gate oxide layer areas 28 over the drift region D1 between the body regions. Optionally, a terraced dielectric layer can also be positioned over the drift regions D2 at the outer peripheries of the body regions adjacent the peripheries of the JFET region, that is, beneath portions of the gate contacts 32B overlying the drift regions laterally outward of the channel regions. The terraced dielectric layer has a second thickness greater than the first thickness of the gate oxide layer.

A pair of counterdoped regions 36 extend along the opposite lateral peripheries of each of the body regions. The counterdoped regions are spaced below the channel regions and away from the source regions and have a doping concentration less than a doping concentration of the body region at the upper surface. As explained in connection with the process, the depth and doping concentrations are controlled in the implantation procedure. Regions 36 will have a net doping like that of the body region (P-type in the example) but a locally-reduced P-type doping concentration as a result of targeted implantation of N-type ions.

SiC Vertical Power MOSFET Process

Figure 6A:
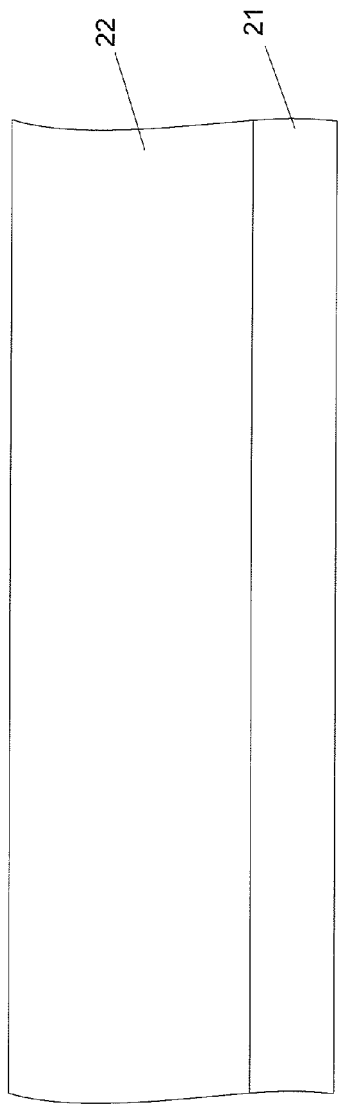
FIG. 6A is a cross-sectional view of starting material for one embodiment of the present invention and FIG. 6B is a cross-sectional view of starting material for a second embodiment.
Figure 6B:
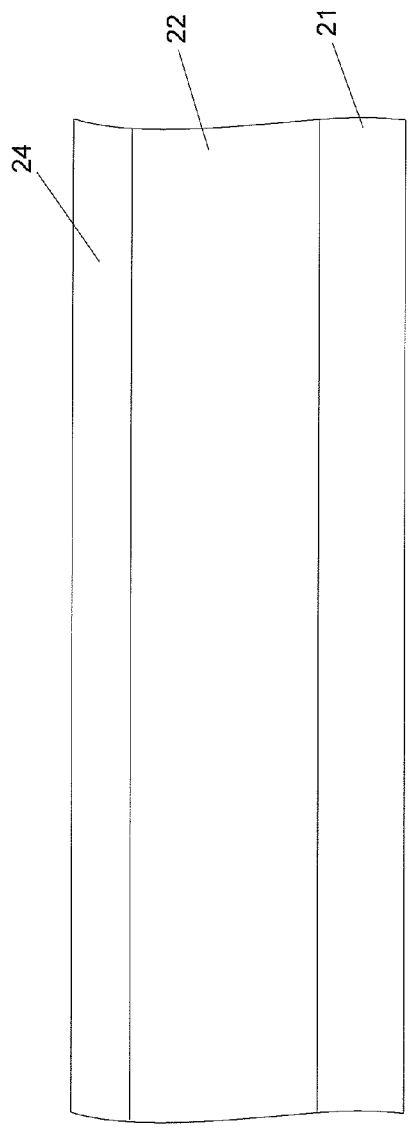

As illustrated in FIGS. 6A and 6B, the Power MOSFET (or IGBT) process starts with an N+ mono-crystalline SiC substrate 21 prepared according to the state of the art technology. The preferred substrate is of the 4H polytype, but any other available polytypes may also be used. An N− SiC drift layer 22 is grown on the substrate, and the substrate together with the drift layer form the starting material for MOSFET fabrication.

Using patterned oxide or photo-resist an N+ layer (JFET layer 23) is placed at the desired depth and with a prescribed doping by ion implantation of a suitable donor species (preferably nitrogen) as shown in FIG. 7A. Alternatively, the N+ layer can be grown epitaxially on top of the N− drift layer and be part of the starting material 24 as shown in FIGS. 6A and 7A. If the second alternative is used then the starting material (wafers) will consist of three layers (substrate, N− drift, and N+ JFET layer). The doping of the JFET layer is about one order of magnitude higher than the doping of the drift layer. The purpose of the JFET layer 23, 24 is to reduce the resistivity in the near surface region of the MOSFET between the channels. The rest of the process description refers to the substrate with JFET region as shown in FIG. 7A but shall understood to pertain likewise to the substrate shown in FIG. 7B.

Figure 8:
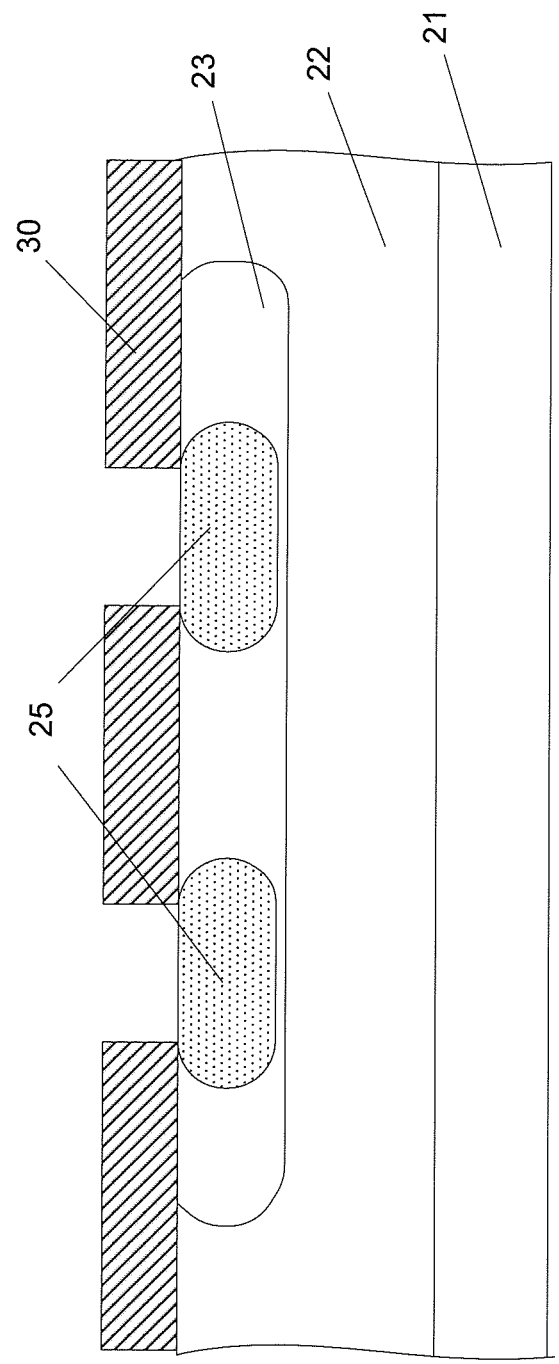
FIG. 8 is a cross-sectional view showing formation of the body regions (P wells) in the JFET region of FIG. 7A.

Using patterned oxide or photo-resist, the P-Body regions 25 are formed by ion implantation of a suitable acceptor species, preferably aluminum, as shown in FIG. 8. To minimize residual implant damage, all implants are preferably done at elevated wafer temperatures in the temperature range 400° C.-1000° C. Retrograde doping of the P-Body regions is, in fact, preferable for ruggedness. Ion implantation naturally forms such a profile, with lighter doping of the P-Body regions at the surface of the wafers and higher (heavier) doping deeper into the SiC wafer. Vertical doping profile of a P-Body or P-Well looks similar to the outer profile illustrated in FIG. 9B.

After patterning a suitable implant mask (such as SiO2), an N-type counter doping implant 36 is performed to reduce the field curvature at the edges of the p-wells as shown in FIG. 9A. The net doping and depth at the edge or periphery of the P-Body are shown in FIG. 9B, lower curve. Counter doping can be done with an energy of about 150 KeV-200 KeV with a dose of about 5e11/cm2 to 5e12/cm2 (Nitrogen).

Figure 10:
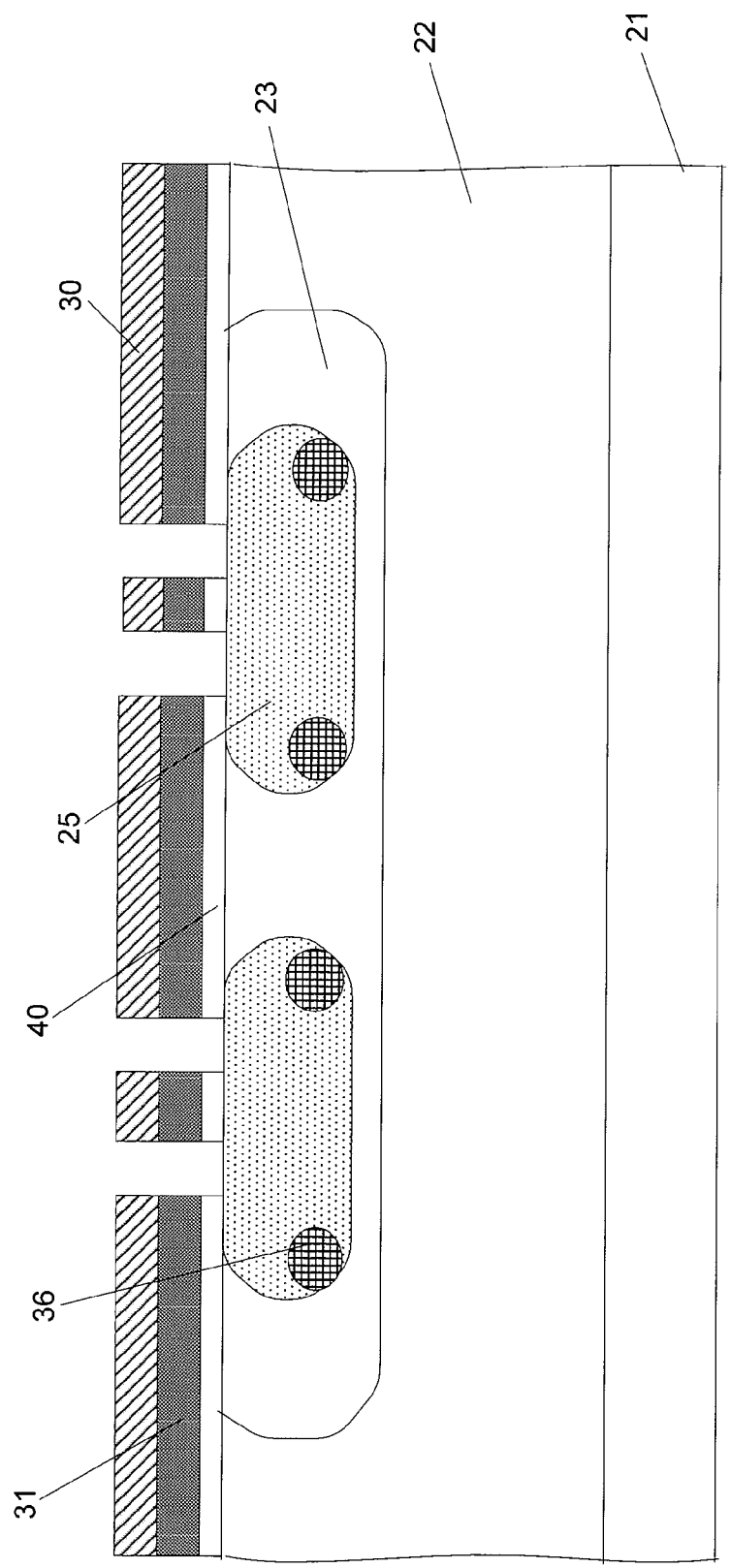
FIG. 10 is a cross-sectional view showing formation and patterning of a sacrificial polysilicon pattern on the substrate of FIG. 9A for source implantation.
Figure 11:
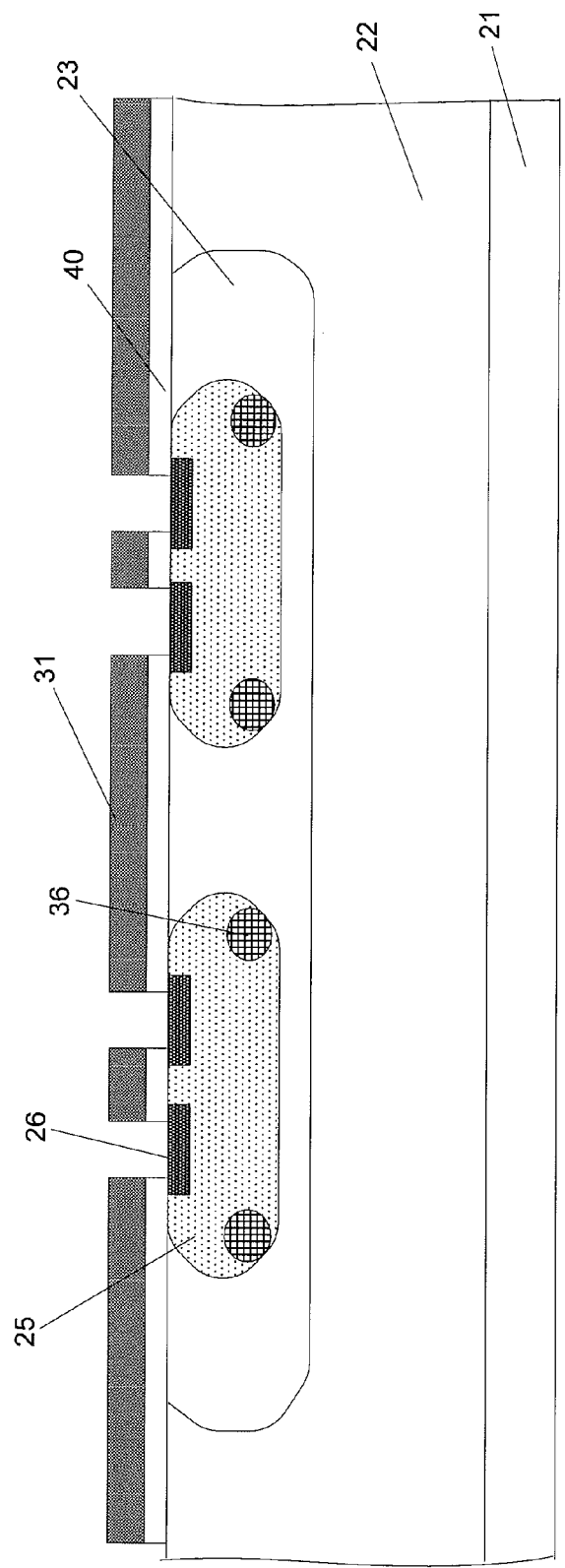
FIG. 11 is a cross-sectional view showing source implantation in the structure of FIG. 10.

By the use of patterned sacrificial oxide 40 or oxide and polysilicon bilayer 31 (FIG. 10), N++ (source) regions 26 are placed at the prescribed locations inside of the P-Wells, again by ion implantation of a suitable donor species (FIG. 11).

The patterned sandwich of oxide and polysilicon constitutes the implant mask for the N++ source regions 26. N++ implants can be done using nitrogen or other donor species. The surface doping of the N++ layer is in the range of $1 \times 10^{20}$ cm$^{-3}$. This is achieved by using nitrogen implantation with an energy range of 10-50 keV and a dose range of 1E14-1E16 cm$^{-2}$.

The depth of the implants and the lateral offset of the N++ regions in relationship to the physical edge of the P-Wells 25 is determined by the voltage rating of the device (i.e., for a higher voltage rating a larger offset should be used, such that the "short channel" effect is avoided).

Figure 12:
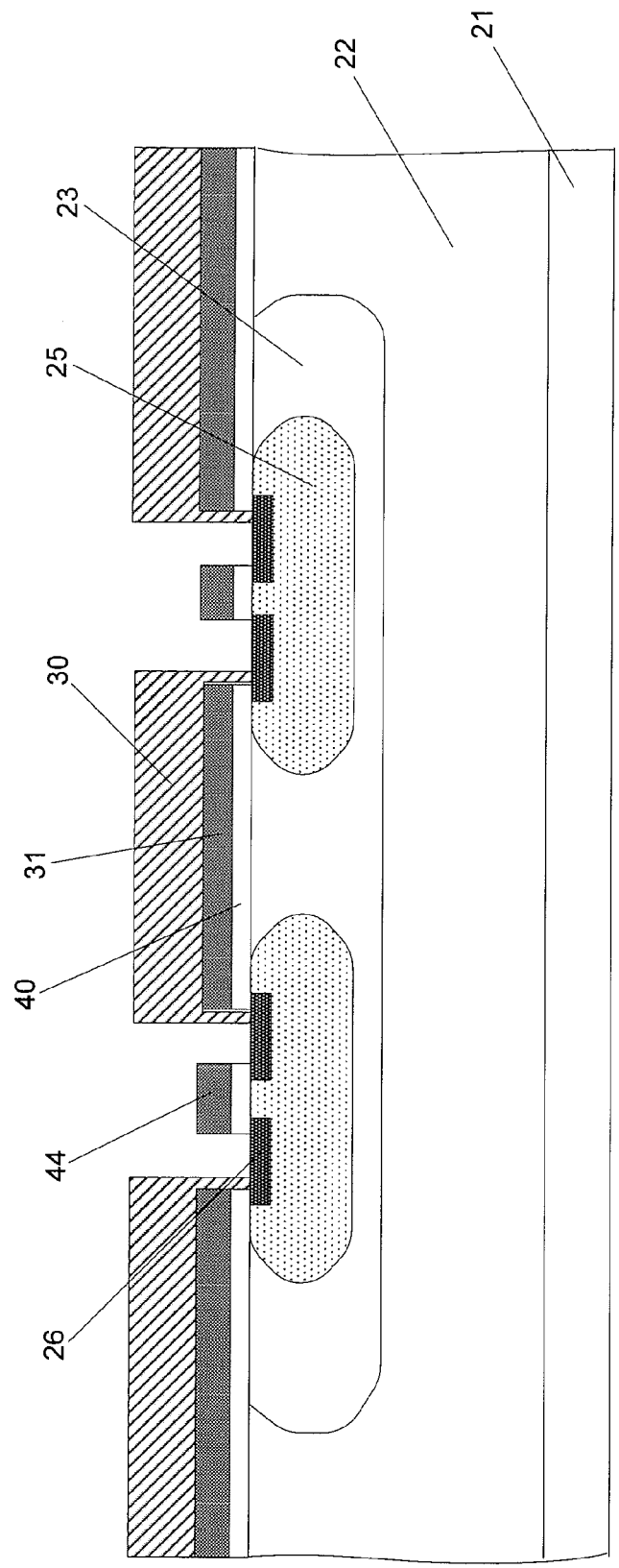
FIG. 12 is a cross-sectional view showing patterning for partial removal of the sacrificial polysilicon pattern in the structure of FIG. 11.

After the N++ implant, a photoresist mask 30 is used (FIG. 12) and the interior oxide and poly implant mask stack 44 from the previous step is etched away, preferably using a wet oxide etch process. More specifically, the oxide underneath the center stack is fully undercut to lift off the poly and fully expose the center part of the P-wells between the source regions 26.

Figure 13:
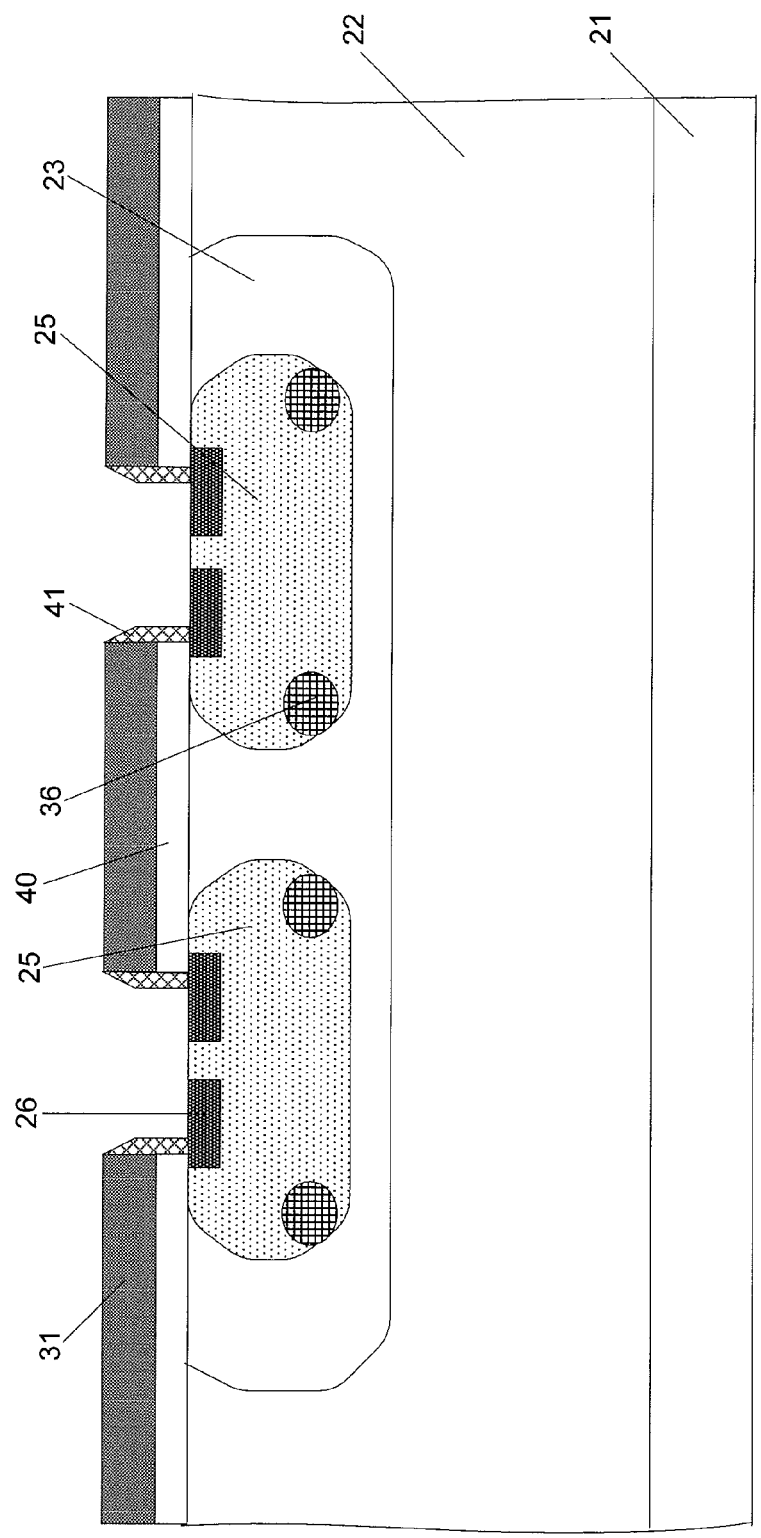
FIG. 13 is a cross-sectional view showing formation of side wall spacers on the remainder of the sacrificial polysilicon pattern in the structure of FIG. 12.

After resist strip, a relatively thin layer of oxide is deposited (preferably by PECVD) on the wafer, with a thickness preferably in the range of 6000-10000 Å. Reactive ion etching of this oxide layer is then done to form oxide spacers 41 on the edge faces of each of the vertical sidewalls of the oxide/poly stacks (FIG. 13).

Figure 14:
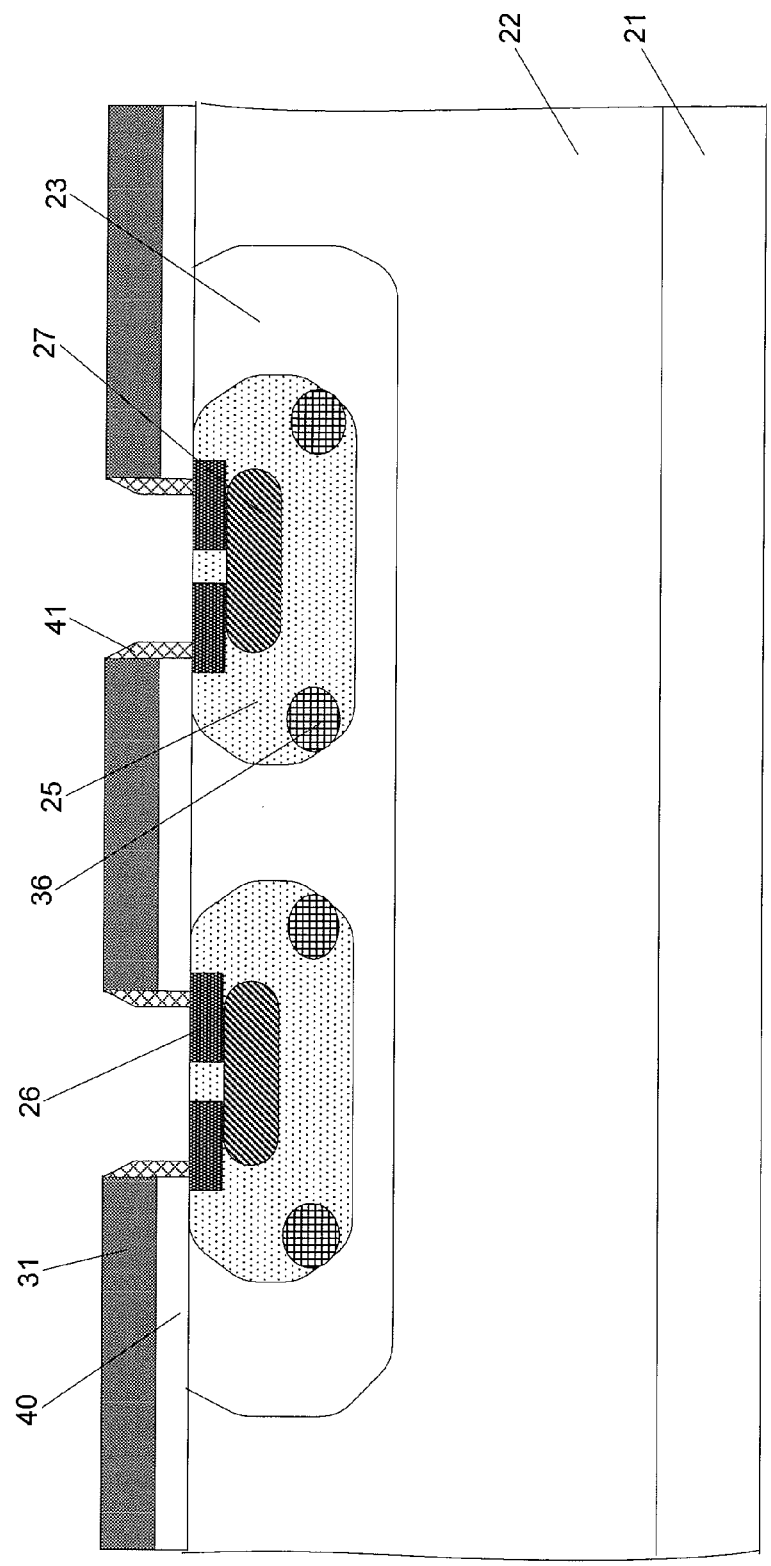
FIG. 14 is a cross-sectional view showing implantation of a UIS region in the body region in the structure of FIG. 13.

A P++ region 27 (UIS1) is formed by ion implantation of a suitable acceptor species (such as Al or B) at a depth greater than the depth of the N++ source region 26 (FIG. 14). For people familiar with the subject it is evident that the role of the P++ layer is to reduce the current gain of the parasitic NPN transistor formed by the source, P-well and the drift layer. This P++ UIS region 27 is laterally offset inward from the outer edge of the N++ sources, and from the channel region, in proportion to the thickness of the thin spacer, and therefore has little or no effect on the surface doping of the MOSFET (and in this way the threshold voltage of the MOSFET is unaffected by this implant). The P++ UIS region 27 is offset depthwise or vertically from the source N++ region 26 by the greater projected range of the implanted species by selecting an appropriate implant energy for the P++ species (typically in the range 150-400 keV).

Following the ion implantation of the P++ region, wafers are immersed in an oxide etch solution and the oxide 40 underneath the polysilicon 31 is etched away, lifting off in this way the entire sheet of the "sacrificial poly." At the end of this process step, SiC wafers will be free of any layers while having a minimum of three implants inside of the semiconductor (four implants if the JFET layer is done by ion implantation and only three implanted layers if the JFET layer is done using Epitaxy).

The Ion Implanted layers are then electrically "activated" and implant lattice damage repaired using conventional SiC high temperature processing. This may include deposition of a carbon anneal cap layer to suppress step bunching followed by a suitable high temperature anneal. The anneal temperature can be done in the range 1400-2200° C. for times of 5-60 minutes.

Figure 15:
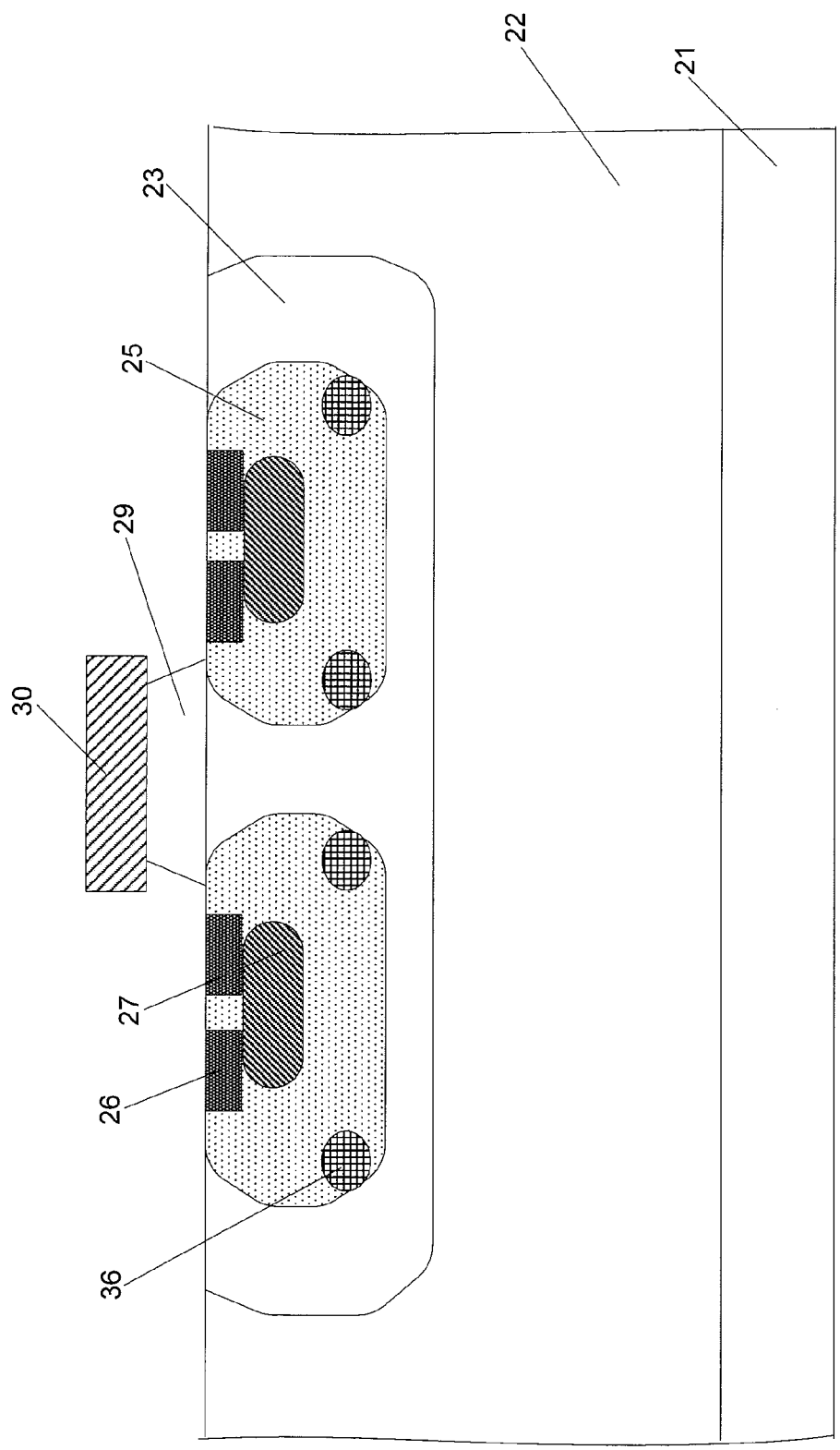
FIG. 15 is a cross-sectional view showing the structure of FIG. 14 after removal of the sacrificial polysilicon pattern and formation of a terrace oxide on the substrate surface between the body regions.

As next seen in FIG. 15, a thick layer of oxide 29 is then deposited, densified, patterned and etched such that "islands" of thick oxide are left in between each of the P-wells. Preferably the etching of the thick oxide layer overlaying the drift region is done such that tapered slopes are left at the edge of the pattern. The sharp corners of the thick oxide are normally created during a dry or wet etch process of any oxide and they are the origin of a number of problems in any semiconductor device.

Figure 16:
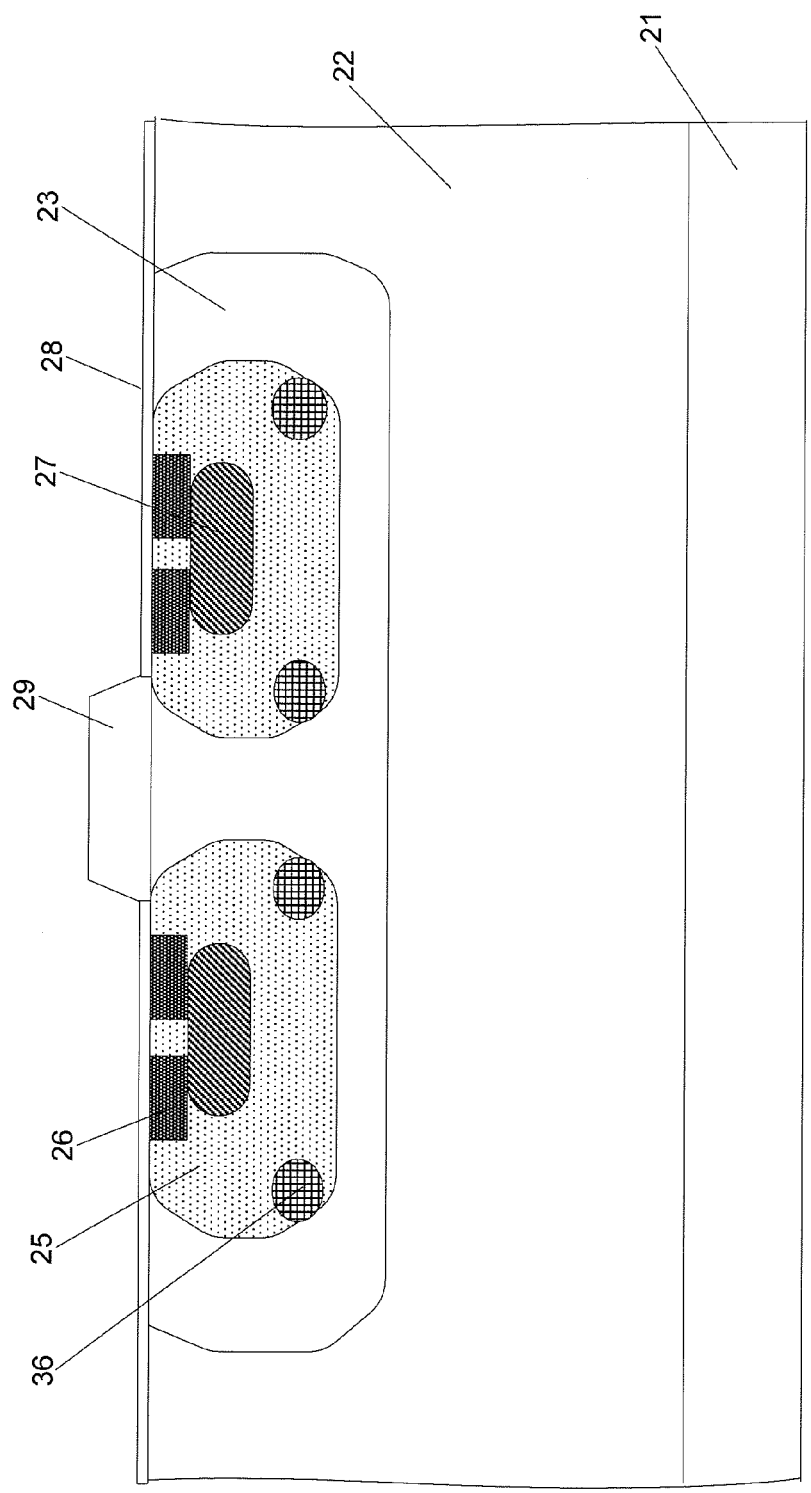
FIG. 16 is a cross-sectional view showing the structure of FIG. 15 after removal of the mask over the terrace oxide and the formation of gate oxide.

The gate oxide layer 28 is then thermally grown on the entire surface of the wafer and properly treated to establish low interface trap densities (FIG. 16). The thickness of the gate oxide layer preferably is about 500 Å. Optionally, the gate oxide can be increased in thickness by depositing a thin polysilicon layer 28A (FIG. 17A) and thermally oxidizing that layer to form a thicker gate oxide 28B (FIG. 17B).

Figure 18:
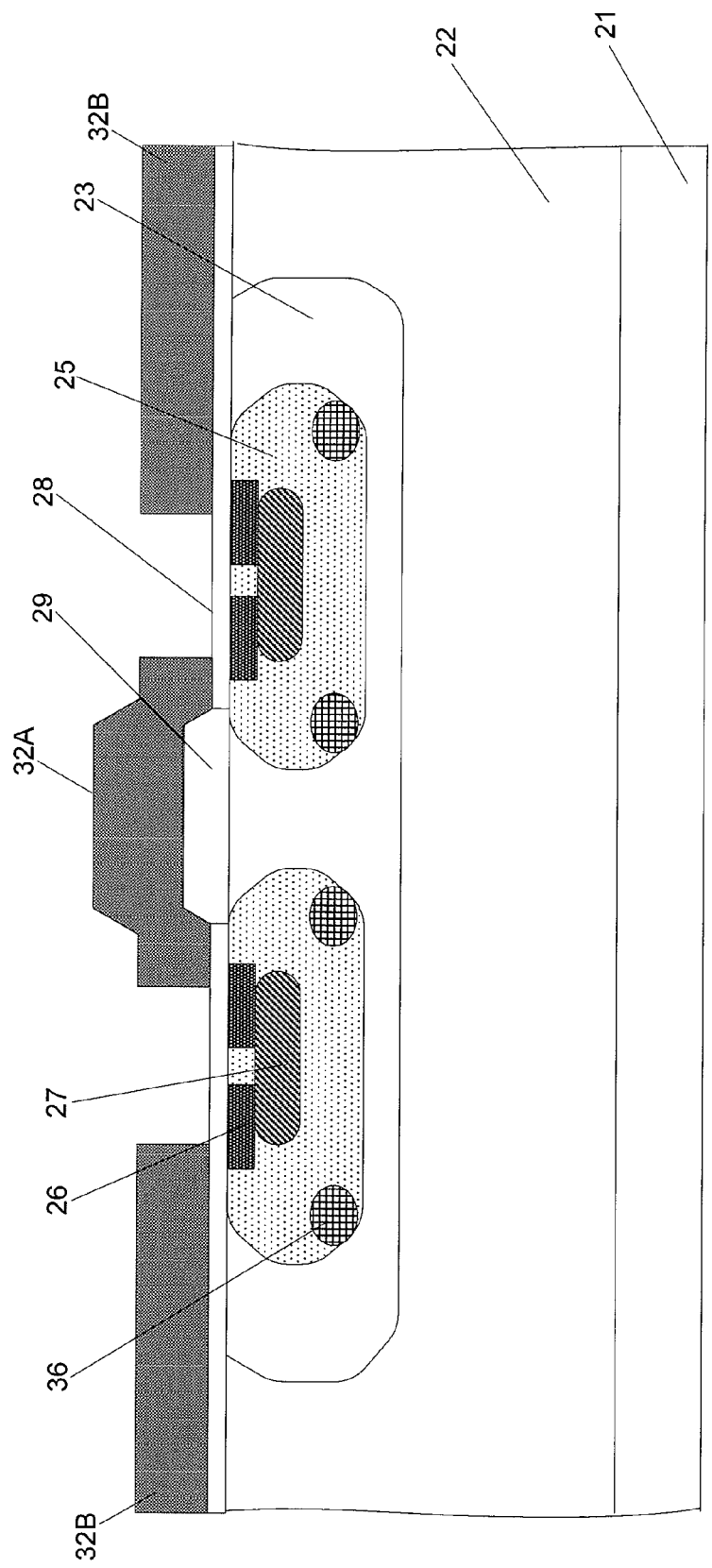
FIG. 18 is a cross-sectional view showing the structure of FIG. 16 after formation and patterning of a gate polysilicon layer over the gate oxide and terrace oxide layers.

Following the formation of the gate oxide layer 28, a polysilicon layer 32 (approx 5000 Å) is deposited on the wafer and N-type doped using either ion implantation or conventional PCl$_3$ furnace doping. The polysilicon gate conductors 32A, 32B are patterned and etched using conventional silicon dry etch techniques (FIG. 18).

Figure 19:
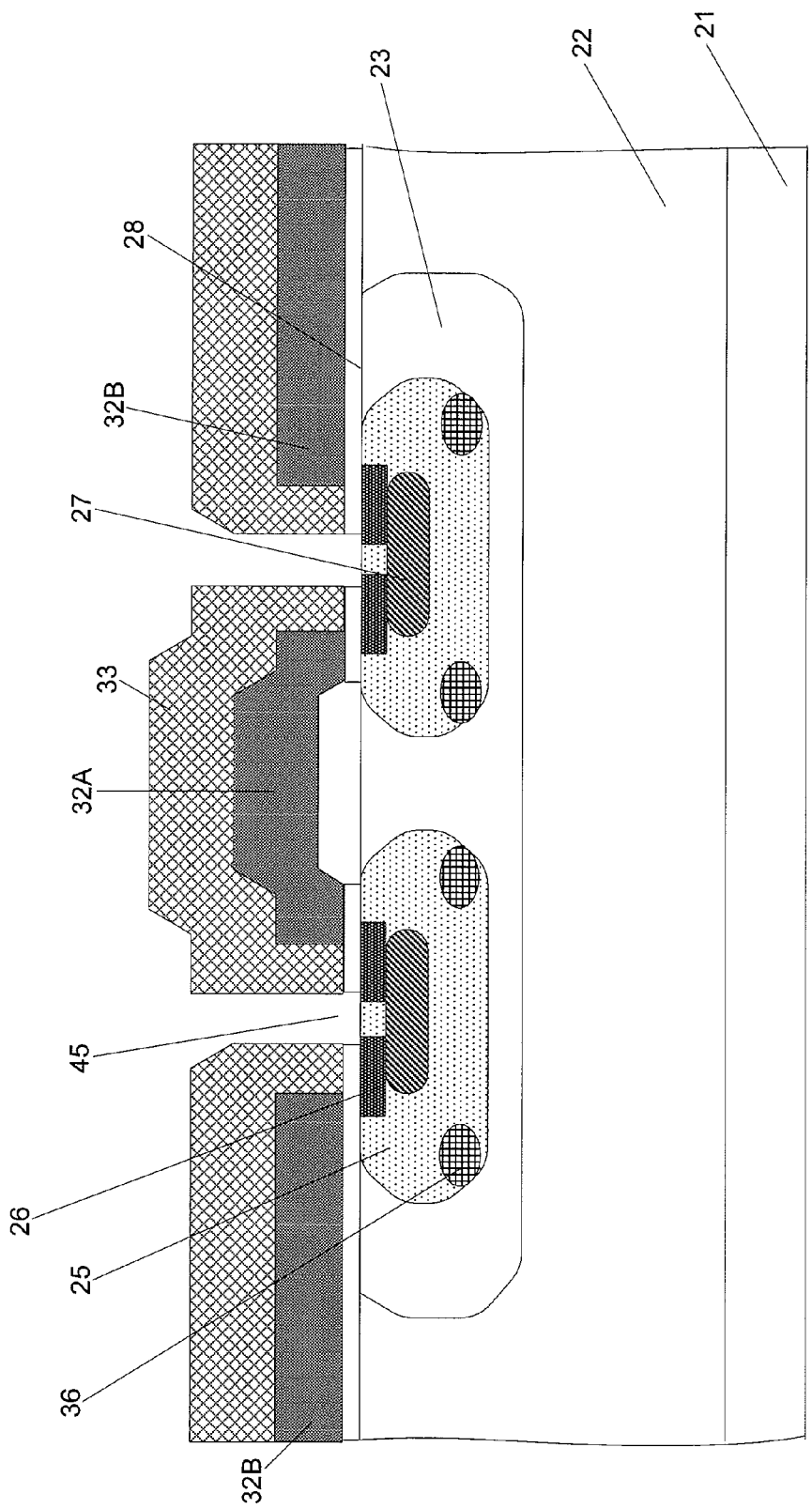
FIG. 19 is a cross-sectional view showing the structure of FIG. 18 after formation and patterning of a dielectric layer over the gate polysilicon layer, with gate vias for metallization as shown in FIG. 1A.

From this point on the SiC MOSFET process follows the flow chart of any power MOSFET device. The poly gate is "sealed" using an inter-layer dielectric 33, such as a flowable BPSG layer. The ILD layer is patterned and etched to create the contact vias 45 to the P-Wells and the N++ (source) regions 26 (FIG. 19).

The source contact metal 47 (preferably Ni, but any metal that will form ohmic contacts to both N+ and P+ SiC will suffice) is deposited on the wafer. In the case of Ni, a "salicide" (Self Aligned Silicide) is formed in the contacts at intermediate temperatures (450-950 C) (FIG. 1).

Nickel is deposited on the backside and silicided, such that ohmic contacts are also formed on the backside of the wafers to serve as the drain contact 48 (FIGS. 1A and 1B and FIG. 20). Optionally, to protect the NiSi layer on the backside a thin oxide layer can be deposited on the backside.

Following this process step a thick Al or Al/Cu layer 34 (approximately 5 μm thick) is deposited on the wafer, patterned according to the design, and wet or dry etched to create the source and the gate pads.

Optionally, a passivation layer 49 (nitride, oxynitride, polyimide or combinations of the former) is deposited, patterned and etched to expose the wirebonding pads. During the clearing of the windows in the passivation the backside oxide is also etched away. Finally, a backside metal 48 (usually Ti/Ni/Ag) is placed on the backside of the wafers to complete the process flow and finish the device.

Having described and illustrated the principles of the invention in a preferred embodiment thereof, it should be apparent that the invention can be modified in arrangement and detail without departing from such principles. We claim all modifications and variation coming within the spirit and scope of the following claims.

The invention claimed is:

1. A silicon carbide (SiC) vertical power MOSFET structure, comprising:
    a SiC substrate including an upper layer of a first dopant type defining a drift region extending from an upper surface of the substrate depthwise into the substrate;
    a body region in the upper layer and adjoining the upper surface of the substrate, the body region being of a second dopant type opposite the first dopant type and having opposite lateral peripheries each forming a first PN junction with the drift region;
    a pair of source regions spaced apart in the body region across the upper surface of the substrate to define source contact regions and positioned with respect to the lateral peripheries of the body region to form a second PN junction spaced laterally from the first PN junction and to define a pair of channel regions along the upper surface between the first and second PN junctions;
    a gate oxide layer on the upper surface extending over each of the channel regions;
    a gate conductor contacting the gate oxide;
    a source conductor contacting the source regions and the body region therebetween; and
    a pair of counterdoped regions extending along the opposite lateral peripheries of the body region, the counterdoped regions spaced below the channel regions and away from the source regions and having a doping concentration less than a doping concentration of the body region at the upper surface.

2. The SiC power MOSFET structure of claim 1, in which the gate oxide layer has a first thickness, the structure further including a terraced dielectric layer on the upper surface extending laterally from the gate oxide layer over the drift region, the terraced dielectric layer having a second thickness greater than the first thickness of the gate oxide layer.

3. The SiC power MOSFET structure of claim 1, including a JFET region of the first dopant type in an upper portion of the upper layer, enhancing a doping concentration of the drift region around the body region.

4. The SiC power MOSFET structure of claim 1, including an unclamped inductive switching (UIS) region of the second dopant type in the upper layer spaced laterally inward from the channel regions beneath the source regions, enhancing a doping concentration of the body region beneath the source regions.

5. A silicon carbide (SiC) vertical power MOSFET structure, comprising:
    a SiC substrate including an upper layer of a first dopant type defining a drift region extending from an upper surface of the substrate depthwise into the substrate;
    a pair of body regions in the upper layer and adjoining the upper surface of the substrate, the body regions being spaced apart about the drift region and of a second dopant type opposite the first dopant type, each of the body regions having opposite lateral peripheries each forming a first PN junction with the drift region;
    a pair of source regions spaced apart in each body region across the upper surface of the substrate to define source contact regions and positioned with respect to the lateral peripheries of each of the body regions to form a second PN junction spaced laterally from the first PN junction and to define a pair of channel regions along the upper surface between the first and second PN junctions;

gate oxide layers of a first thickness on the upper surface extending over each of the channel regions;

a gate conductor contacting each of the gate oxide layers;

a source conductor contacting the source regions and the body regions therebetween;

a pair of counterdoped regions extending along the opposite lateral peripheries of the body regions, the counter doped regions spaced below the channel regions and away from the source regions and having a doping concentration less than a doping concentration of the body regions at the upper surface; and a terraced dielectric layer on the upper surface extending between each of the gate oxide layers over the drift region, the terraced dielectric layer having a second thickness greater than the first thickness of the gate oxide layers and having opposite edges that have tapered slopes.

6. The SiC power MOSFET structure of claim 5, including a JFET region of the first dopant type in an upper portion of the upper layer, enhancing a doping concentration of the drift region around the body regions.

7. The SiC power MOSFET structure of claim 6, in which the JFET region encompasses the pair of body regions.

8. The SiC power MOSFET structure of claim 5, including an unclamped inductive switching (UIS) region of the second dopant type in the upper layer spaced laterally inward from the channel regions beneath the source regions, enhancing a doping concentration of the body regions beneath the source regions.

9. The SiC power MOSFET structure of claim 5, in which the SiC substrate includes a bottom layer of the second dopant type opposite the first dopant type such that the structure is operative as an insulated gate bipolar transistor (IGBT).

* * * * *